(12) United States Patent
Sung et al.

(10) Patent No.: US 11,024,586 B2
(45) Date of Patent: Jun. 1, 2021

(54) SEMICONDUCTOR DEVICE PACKAGE AND METHOD OF MANUFACTURING THE SAME

(71) Applicant: ADVANCED SEMICONDUCTOR ENGINEERING, INC., Kaoshiung (TW)

(72) Inventors: Chia-Hao Sung, Kaohsiung (TW); Hsuan-Yu Chen, Kaohsiung (TW); Yu-Kai Lin, Kaohsiung (TW)

(73) Assignee: ADVANCED SEMICONDUCTOR ENGINEERING, INC., Kaoshiung (TW)

( * ) Notice: Subject to any disclaimer, the term of this patent is extended or adjusted under 35 U.S.C. 154(b) by 0 days.

(21) Appl. No.: 16/254,382

(22) Filed: Jan. 22, 2019

(65) Prior Publication Data

US 2020/0235056 A1 Jul. 23, 2020

(51) Int. Cl.
| H01L 23/31 | (2006.01) |
| H01L 21/48 | (2006.01) |
| H01L 23/00 | (2006.01) |
| H01L 23/538 | (2006.01) |
| H01L 21/56 | (2006.01) |

(52) U.S. Cl.
CPC ........ *H01L 23/562* (2013.01); *H01L 21/4853* (2013.01); *H01L 21/4857* (2013.01); *H01L 21/565* (2013.01); *H01L 21/568* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 2224/214* (2013.01); *H01L 2924/3511* (2013.01)

(58) Field of Classification Search
CPC . H01L 21/48; H01L 21/4853; H01L 21/4857; H01L 21/568; H01L 23/56; H01L 23/562; H01L 23/53; H01L 23/5383; H01L 23/5386; H01L 23/5389; H01L 23/31; H01L 23/3128; H01L 24/19; H01L 24/20
USPC .......................................................... 257/668
See application file for complete search history.

(56) References Cited

U.S. PATENT DOCUMENTS

| 2002/0004124 | A1 | 1/2002 | Hirasawa et al. | |
| 2015/0021754 | A1* | 1/2015 | Lin | H01L 23/5389 257/712 |
| 2016/0148857 | A1* | 5/2016 | Lin | H01L 23/49811 257/762 |
| 2017/0025364 | A1* | 1/2017 | Yu | H01L 21/568 |
| 2017/0033062 | A1* | 2/2017 | Liu | H01L 21/486 |
| 2019/0096824 | A1* | 3/2019 | Hur | H01L 21/568 |
| 2019/0341369 | A1* | 11/2019 | Chang Chien | G01R 31/2853 |
| 2020/0013721 | A1* | 1/2020 | Chiang | H01L 21/6835 |

* cited by examiner

*Primary Examiner* — Fazli Erdem
(74) *Attorney, Agent, or Firm* — Foley & Lardner LLP

(57) ABSTRACT

A semiconductor device package includes a semiconductor die, a first conductive element, a second conductive element, a metal layer, and a first redistribution layer (RDL). The semiconductor die includes a first surface and a second surface opposite to the first surface. The first conductive element is disposed on the second surface of the semiconductor die. The second conductive element is disposed next to the semiconductor die. The metal layer is disposed on the second conductive element and electrically connected to the second conductive element. The first RDL is disposed on the metal layer and electrically connected to the metal layer.

20 Claims, 33 Drawing Sheets

SEMICONDUCTOR DEVICE PACKAGE AND METHOD OF MANUFACTURING THE SAME

BACKGROUND

1. Technical Field

The present disclosure relates generally to a semiconductor device package, and more particularly, to a semiconductor device package including a metal layer and a method of manufacturing the same.

2. Description of the Related Art

When manufacturing a semiconductor device package, a carrier is utilized to support a semiconductor structure during operations such as die attaching or molding. A de-carrier operation to remove the carrier is often performed before completion of the manufacturing process. However, adhesive materials such as tape or film used when disposing the carrier may remain on the semiconductor structure, causing subsequent problems such as reliability concerns due to contamination by the remaining material. In addition, warpage of the semiconductor structure may occur after the carrier is removed.

SUMMARY

In one aspect, according to some embodiments, a semiconductor device package includes a semiconductor die, a first conductive element, a second conductive element, a metal layer, and a first redistribution layer (RDL). The semiconductor die includes a first surface and a second surface opposite to the first surface. The first conductive element is disposed on the second surface of the semiconductor die. The second conductive element is disposed next to the semiconductor die. The metal layer is disposed on the second conductive element and electrically connected to the second conductive element. The first RDL is disposed on the metal layer and electrically connected to the metal layer.

In another aspect, according to some embodiments, a semiconductor device package includes a semiconductor die, an encapsulant, and a metal layer. The semiconductor die includes a backside surface and an active surface. The encapsulant surrounds the semiconductor die. The encapsulant includes a first surface coplanar with the backside surface of the semiconductor die and a second surface opposite to the first surface of the encapsulant. The metal layer is disposed on the backside surface of the semiconductor die and the first surface of the encapsulant.

In yet another aspect, according to some embodiments, a method of manufacturing a semiconductor device package includes (a) providing a carrier; (b) providing a metallic layer on the carrier, the metallic layer comprising a first layer and a second layer on the first layer; (c) disposing a semiconductor die on the second layer of the metallic layer; (d) forming an encapsulant covering the semiconductor die and the second layer of the metallic layer; and (e) removing the carrier and the first layer of the metallic layer.

BRIEF DESCRIPTION OF THE DRAWINGS

Aspects of the present disclosure are best understood from the following detailed description when read with the accompanying drawings. It is noted that various features may not be drawn to scale, and, in the drawings, the dimensions of the depicted features may be arbitrarily increased or reduced for clarity of discussion.

Common reference numerals are used throughout the drawings and the detailed description to indicate the same or similar elements. The present disclosure will be more readily understood from the following detailed description taken in conjunction with the accompanying drawings.

DETAILED DESCRIPTION

According to some embodiments of the present disclosure, employment of a metallic layer which includes two layers of metal foils between a carrier and a semiconductor structure to replace adhesive materials such as tape or film and removal of one of the metal foils during the de-carrier operation eliminates the issue of remaining adhesive material, and the remaining metal foil (or metal layer) can reduce warpage of the semiconductor structure and serve as a seed layer for subsequent operations.

Figure 1A:
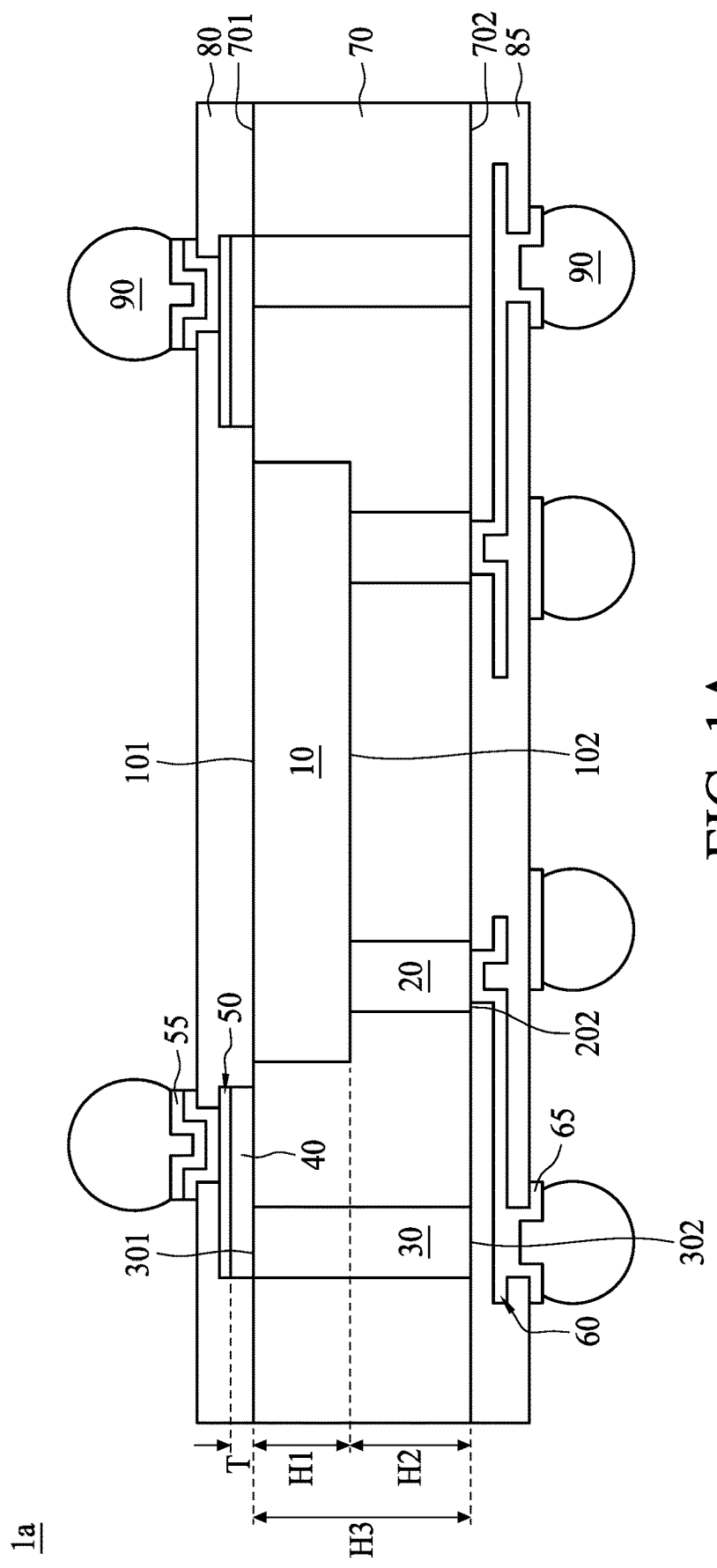
FIG. 1A illustrates a cross-sectional view of a semiconductor device package in accordance with some embodiments of the present disclosure.

FIG. 1A illustrates a cross-sectional view of a semiconductor device package 1a in accordance with some embodiments of the present disclosure.

The semiconductor device package 1a includes a semiconductor die 10, conductive elements 20 and 30, a metal layer 40, redistribution layers 50 and 60, an encapsulant 70, insulation layers 80 and 85, and connection elements 90.

The semiconductor die 10 includes a surface 101 and a surface 102 opposite to the surface 101. In some embodiments, the surface 101 may be referred to as a backside surface and the surface 102 may be referred to as an active surface. The surface 102 may have electrical circuits disposed thereon. The semiconductor die 10 may be a chip or a die including a semiconductor substrate, one or more integrated circuit devices and one or more overlying interconnection structures therein. The integrated circuit devices may include active devices such as transistors and/or passive devices such as resistors, capacitors, inductors, or a combination thereof.

The conductive element 20 is disposed on the surface 102 of the semiconductor die 10. The conductive element 20 may be electrically connected to the semiconductor die 10.

The conductive element 20 may be a conductive pillar. The conductive element 20 has a surface 202 exposed from the encapsulant 70 or exposed from a surface 702 of the encapsulant 70. The conductive element 20 may have a height between 20 μm and 30 μm. The conductive element 20 may include conductive material, for example, aluminum (Al), copper (Cu), chromium (Cr), tin (Sn), gold (Au), silver (Ag), nickel (Ni), stainless steel, or a mixture, alloy, or other combination thereof.

The conductive element 30 is disposed next to the semiconductor die 10. The conductive element 30 is spaced apart from the semiconductor die 10. The conductive element 30 may be a conductive pillar. The conductive element 30 has a surface 302 exposed from the encapsulant 70 or exposed from a surface 702 of the encapsulant 70. The surface 302 of the conductive element 30 may be substantially coplanar with the surface 202 of the conductive element 20. In some embodiments, a surface 301 of the conductive element 30 is coplanar with the surface 101 of the semiconductor die 10. A height H3 of the conductive element 30 may be a sum of a height H2 of the conductive element 20 and a thickness H1 of the semiconductor die 10. The conductive element 30 may include conductive material, for example, Al, Cu, Cr, Sn, Au, Ag, Ni, stainless steel, or a mixture, alloy, or other combination thereof. The material of the conductive element 30 may be the same or different from that of the conductive element 20 depending on different design specifications.

The encapsulant 70 includes a surface 701 and a surface 702 opposite to the surface 701. The encapsulant 70 encapsulates or surrounds the semiconductor die 10, the conductive element 20 and the conductive element 30. The surface 701 of the encapsulant 70 is coplanar with the surface 101 of the semiconductor die 10. In the embodiment shown in FIG. 1A, the encapsulant 70 exposes the surface 202 of the conductive element 20, the surfaces 301 and 302 of the conductive element 30, and the surface 101 of the semiconductor die 10. The encapsulant 70 may include an epoxy resin having fillers, a molding compound (e.g., an epoxy molding compound or other molding compound), a polyimide, a phenolic compound or material, a material with a silicone dispersed therein, or a combination thereof.

The metal layer 40 is disposed on the conductive element 30 and electrically connected to the conductive element 30. For example, the metal layer 40 is contact with the surface 301 of the conductive element 30 that is exposed from the encapsulant 70. The metal layer 40 is disposed on the surface 701 of the encapsulant 70. In some embodiments, a thickness T of the metal layer 40 is equal to or greater than 1 μm. For example, the thickness T of the metal layer 40 may be in a range from 3 μm to 5 μm. The metal layer 40 may be a seed layer of the RDL 50. The metal layer 40 may include metallic material, for example, Al, Cu, Cr, Sn, Au, Ag, Ni, stainless steel, or a mixture, an alloy, or other combination thereof. The metal layer 40 may be or include a copper foil.

The RDL 50 is disposed on and electrically connected to the metal layer 40. The RDL 50 includes an under bump metallurgy (UBM) 55 exposed from the insulation layer 80. The RDL 60 is disposed on or over the surface 702 of the encapsulant 70. The RDL 60 includes a UBM 65 exposed from the insulation layer 85. The RDL 60 may be electrically connected to the conductive element 20 and/or the conductive element 30. The RDL 50 and the RDL 60 may be electrically connected through the conductive element 30.

The insulation layer 80 is disposed on the surface 701 of the encapsulant 70 and the surface 101 of the semiconductor die 10. The insulation layer 80 surrounds or covers the metal layer 40 and the RDL 50, and exposes the UBM 55 of the RDL 50. A portion of the insulation layer 80 is between the UBM 55 of the RDL 50 and a portion of the RDL 50 on the metal layer 40. The insulation layer 85 is disposed on the surface 702 of the encapsulant 70, the surface 202 of the conductive element 20 and the surface 302 of the conductive element 30. The insulation layer 85 surrounds or covers the RDL 60, and exposes the UBM 65 of the RDL 60. The insulation layers 80 and 85 may include dielectric or polyimide (PI) material.

The connection elements 90 are disposed on the UBMs 55 of the RDL 50 and the UBMs 65 of the RDL 60. The connection elements 90 may include solder balls.

Figure 1B:
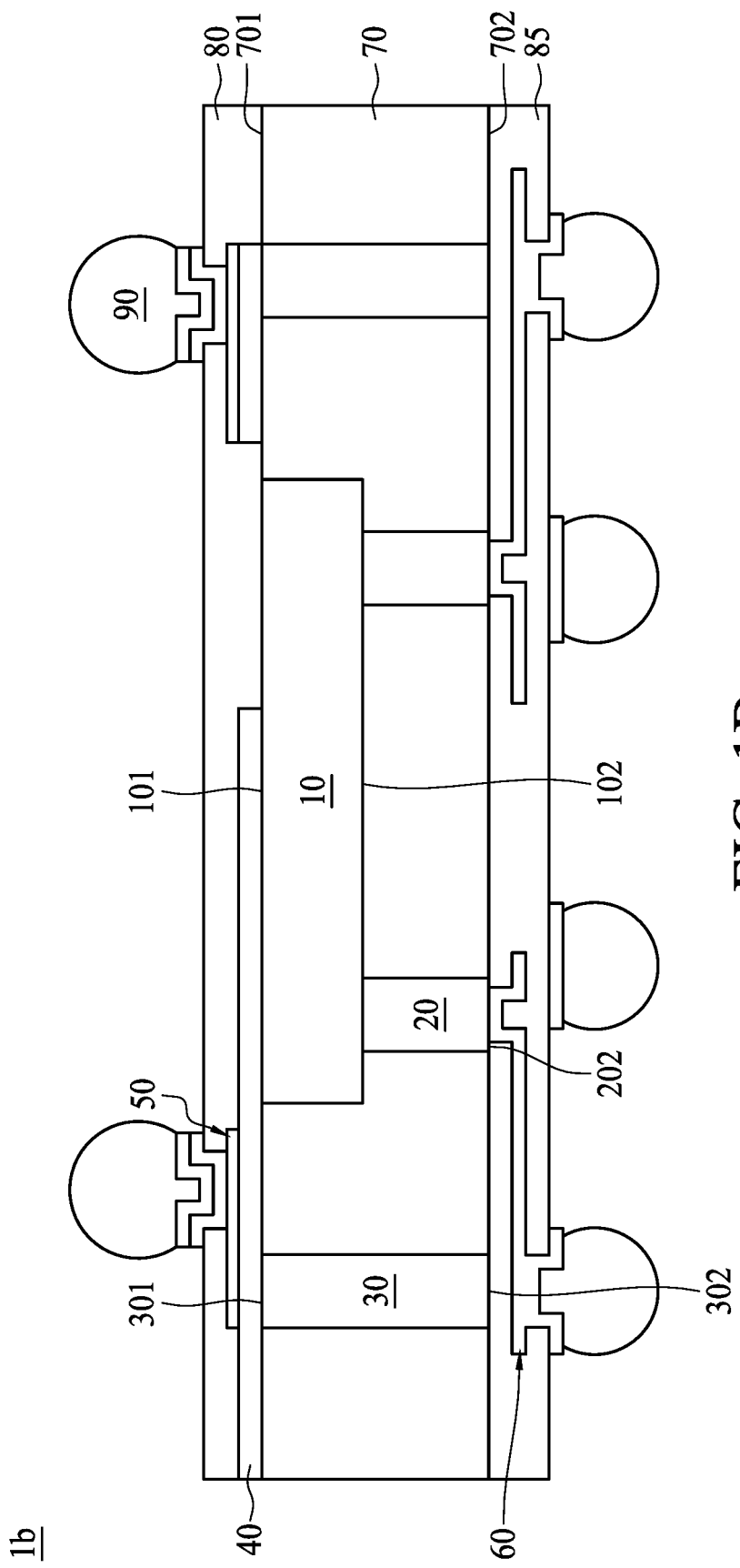
FIG. 1B illustrates a cross-sectional view of a semiconductor device package in accordance with some embodiments of the present disclosure.

FIG. 1B illustrates a cross-sectional view of a semiconductor device package 1b in accordance with some embodiments of the present disclosure. The semiconductor device package 1b is similar to the semiconductor device package 1a in FIG. 1A with some differences described below.

The metal layer 40 is disposed on or covers the surface 701 of the encapsulant 70, the surface 301 of the conductive element 30 and the surface 101 of the semiconductor die 10. In some embodiments, the metal layer 40 may entirely cover the surface 701 of the encapsulant 70, the surface 301 of the conductive element 30 and/or the surface 101 of the semiconductor die 10. The configuration of the metal layer 40 may enhance mechanical or structural strength of the semiconductor device package 1b, and a maximum warpage value of the semiconductor device package 1b may be equal to or less than 10 mm.

Figure 1C:
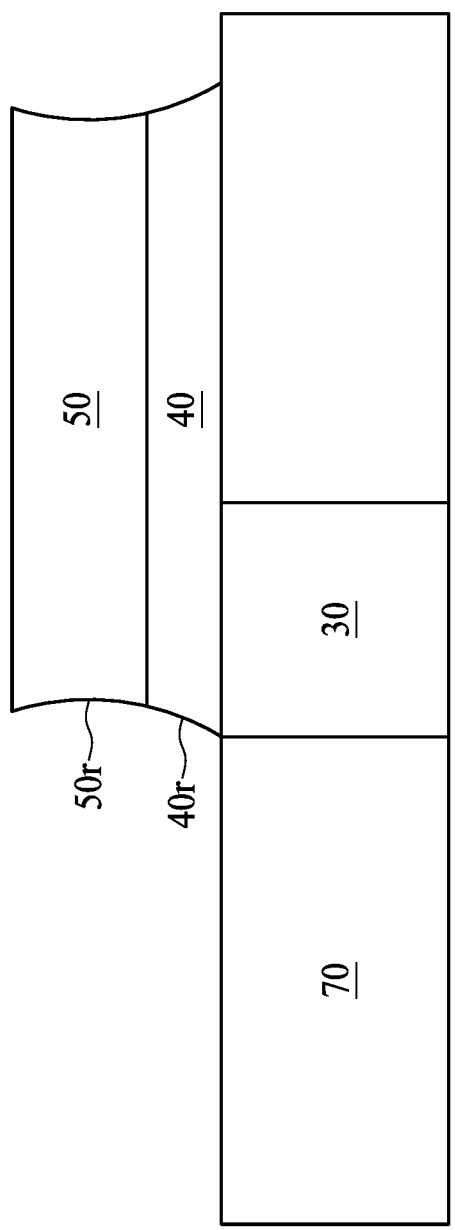
FIG. 1C illustrates an enlarged view of a portion of a semiconductor device package in accordance with some embodiments of the present disclosure.

FIG. 1C illustrates an enlarged view of a portion of a semiconductor device package in accordance with some embodiments of the present disclosure. As shown in FIG. 1C, a recess 50r is defined or formed on a lateral surface of the RDL 50, and a recess 40r is defined or formed on a lateral surface of the metal layer 40. The lateral surface of the RDL 50 and the lateral surface of the metal layer 40 may be coplanar. In some embodiments, the recesses 40r and 50r may be resulted due to an etching/patterning/lithographic operation during manufacturing the semiconductor device package.

Figure 2:
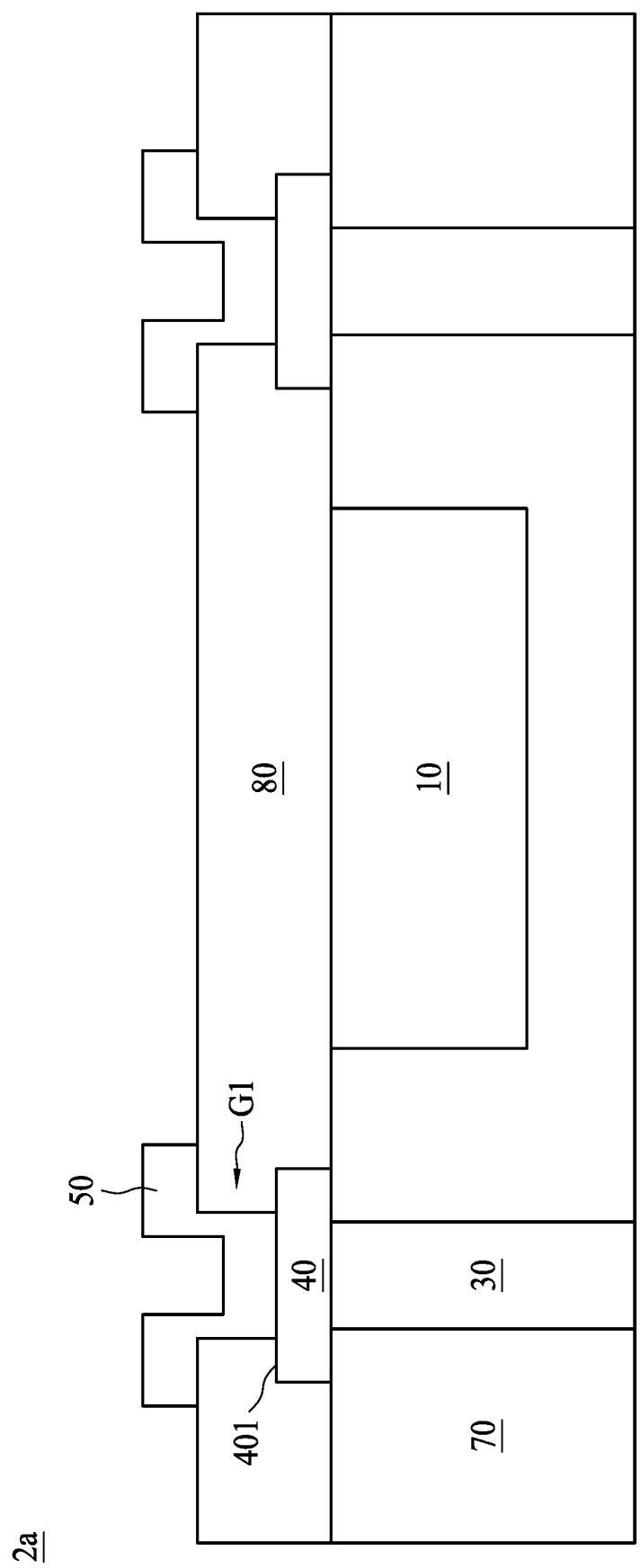
FIG. 2 illustrates a cross-sectional view of a semiconductor device package in accordance with some embodiments of the present disclosure.

FIG. 2 illustrates a cross-sectional view of a semiconductor device package 2a in accordance with some embodiments of the present disclosure. The semiconductor device package 2a is similar to the semiconductor device package 1a in FIG. 1A with some differences described below.

The conductive element 20, the RDL 60 and the connection elements 90 of the semiconductor device package 1a in FIG. 1A are omitted. The metal layer 40 is not fully covered by the RDL 50. For example, a surface 401 of the metal layer 40 is exposed from the RDL 50. As shown in FIG. 2, a gap G1 is defined between the metal layer 40 and the RDL 50, and is filled by the insulation layer 80.

Figure 3:
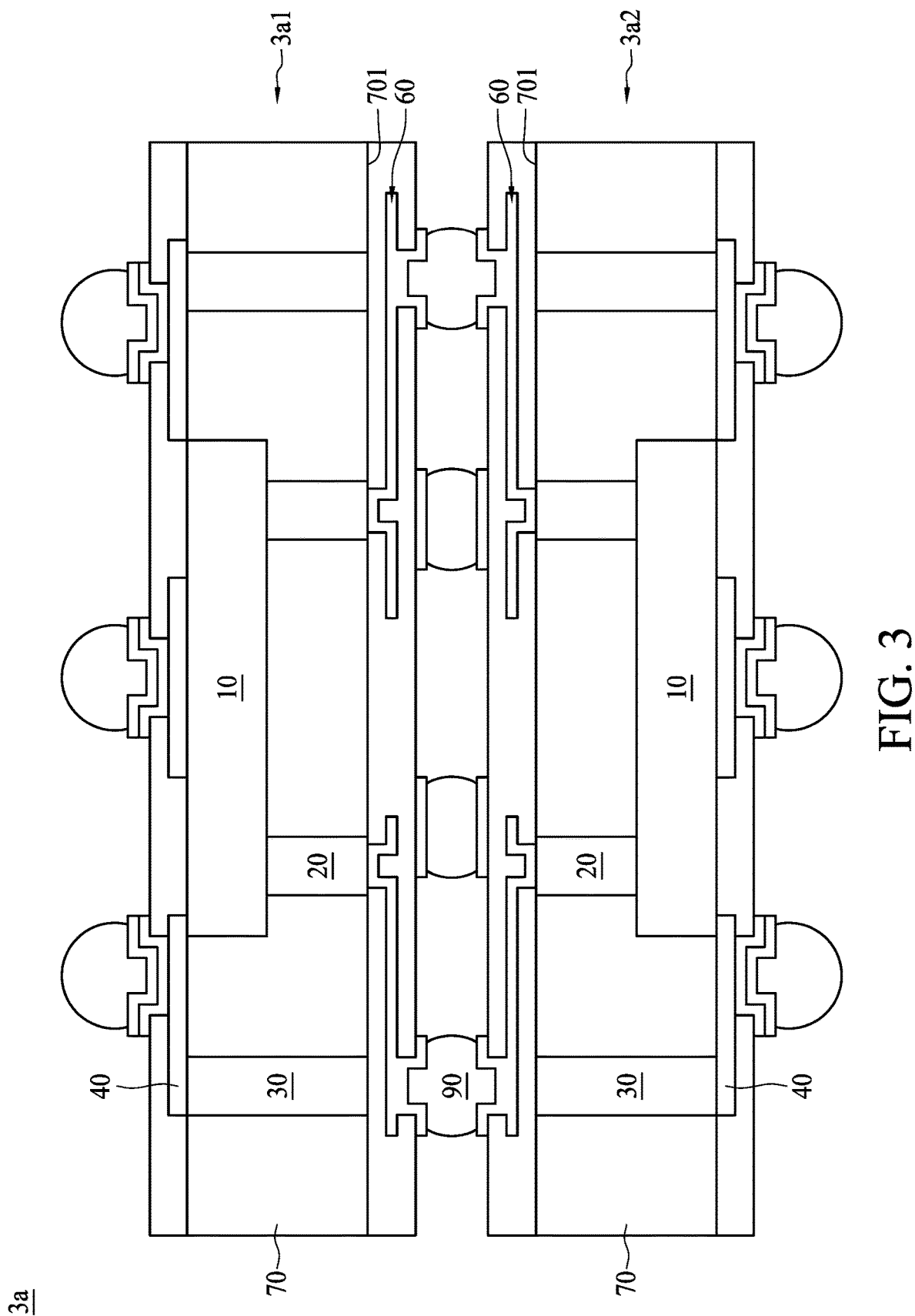
FIG. 3 illustrates a cross-sectional view of a semiconductor device package in accordance with some embodiments of the present disclosure.

FIG. 3 illustrates a cross-sectional view of a semiconductor device package 3a in accordance with some embodiments of the present disclosure. The semiconductor device package 3a includes a semiconductor device package 3a1 and a semiconductor device package 3a2. The semiconductor device package 3a1 and/or the semiconductor device package 3a2 is similar to the semiconductor device package 1a in FIG. 1A. As shown in FIG. 3, the surface 701 of the encapsulant 70 of the semiconductor device package 3a1 faces toward the surface 701 of the encapsulant 70 of the semiconductor device package 3a2. The semiconductor device package 3a1 and the semiconductor device package 3a2 are electrically connected through the connection elements 90 connected to the RDL 60 of the semiconductor device package 3a1 and the RDL 60 of the semiconductor device package 3a2.

FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L and FIG. 4M are cross-sectional views of a semiconductor device package 4m fabricated at various stages, in accordance with some embodiments of the present disclosure.

Figure 4A:
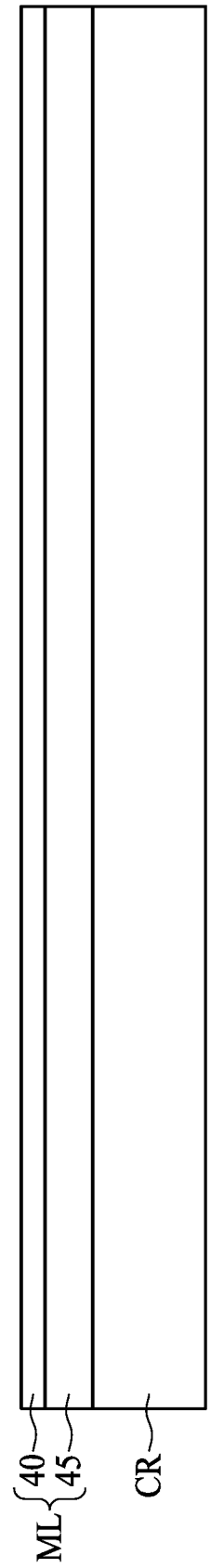
FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L and FIG. 4M are cross-sectional views of a semiconductor device package fabricated at various stages, in accordance with some embodiments of the present disclosure.

Referring to FIG. 4A, a carrier CR is provided. The carrier CR may include glass or other materials. A metallic layer ML is provided on the carrier CR. The metallic layer ML includes a metal layer 45 disposed on and in contact with the carrier CR and a metal layer 40 disposed on the metal layer 45. The metal layer 40 and/or the metal layer 45 may have similar properties to the metal layer 40 of the semiconductor device package 1a in FIG. 1A. A thickness of the metal layer 40 may be equal to or greater than 1 μm. For example, the thickness of the metal layer 40 may be in a range from 3 μm to 5 μm. A thickness of the metal layer 45 may be equal to or greater than 15 μm. For example, the thickness of the metal layer 45 may be 18 μm. The thickness configuration of the metal layers 40 and 45 may facilitate the operation of separating the metal layer 40 and the metal layer 45 illustrated in FIG. 4D.

Figure 4B:
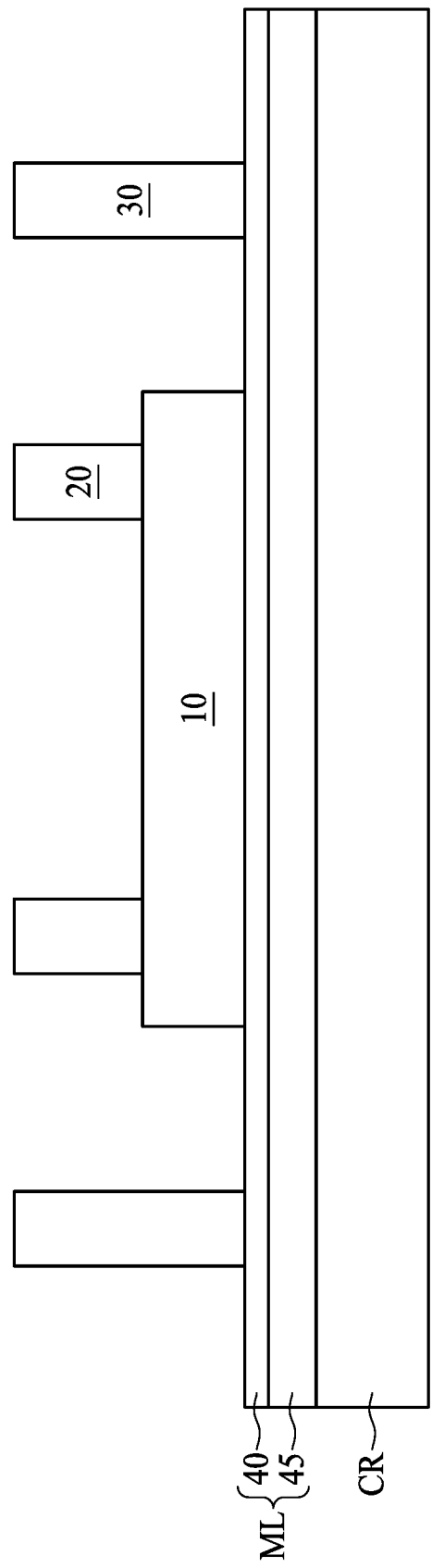

Referring to FIG. 4B, a semiconductor die 10 is disposed on the layer M2 of the metallic layer ML. The semiconductor die 10 may be disposed by a die bonding operation or flip-chip bonding operation which may include a curing operation. Conductive elements 20 are disposed on the semiconductor die 10 and may be electrically connected to a circuit of the semiconductor die 10, wherein the circuit may be on an active surface of the semiconductor die 10. Conductive elements 30 are disposed on the metal layer 40 and may be connected to the metal layer 40 by a metallic bonding force, wherein a curing operation may be performed.

Figure 4C:
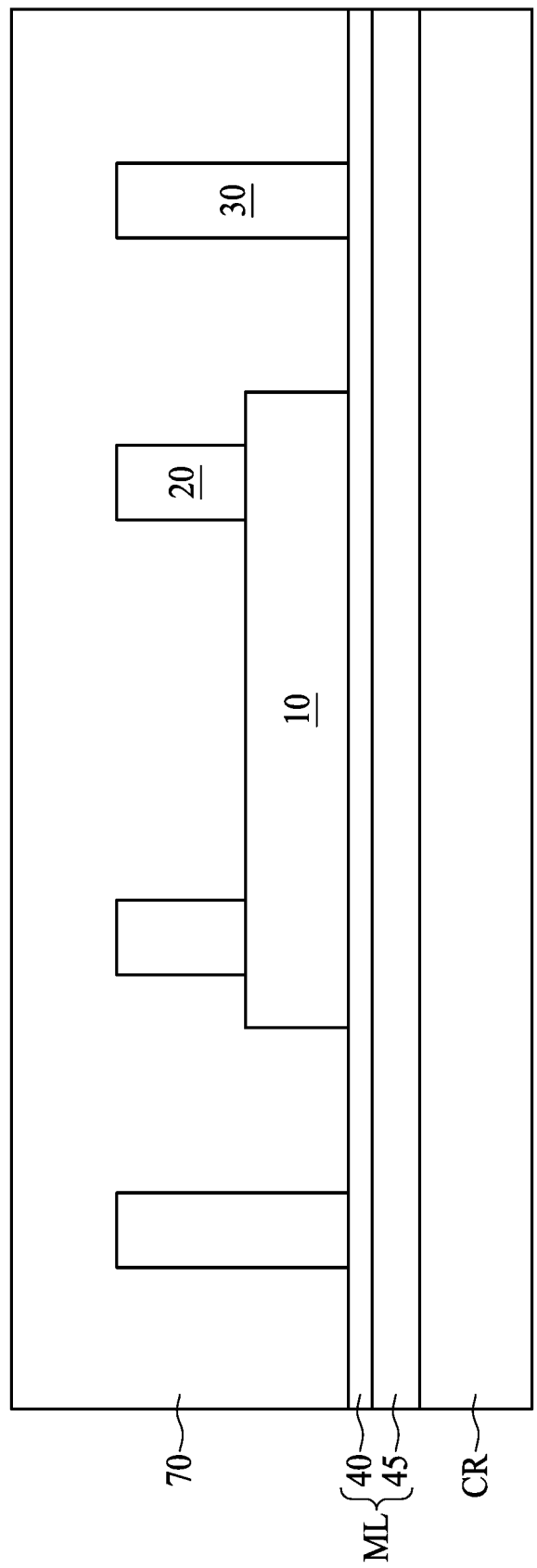

Referring to FIG. 4C, an encapsulant 70 is formed on the metal layer 40 and the semiconductor die 10. The encapsulant 70 encapsulates or covers the conductive elements 20, the conductive elements 30, the semiconductor die 10 and the metal layer 40 of the metallic layer ML. The encapsulant 70 may be formed by a molding operation.

Figure 4D:
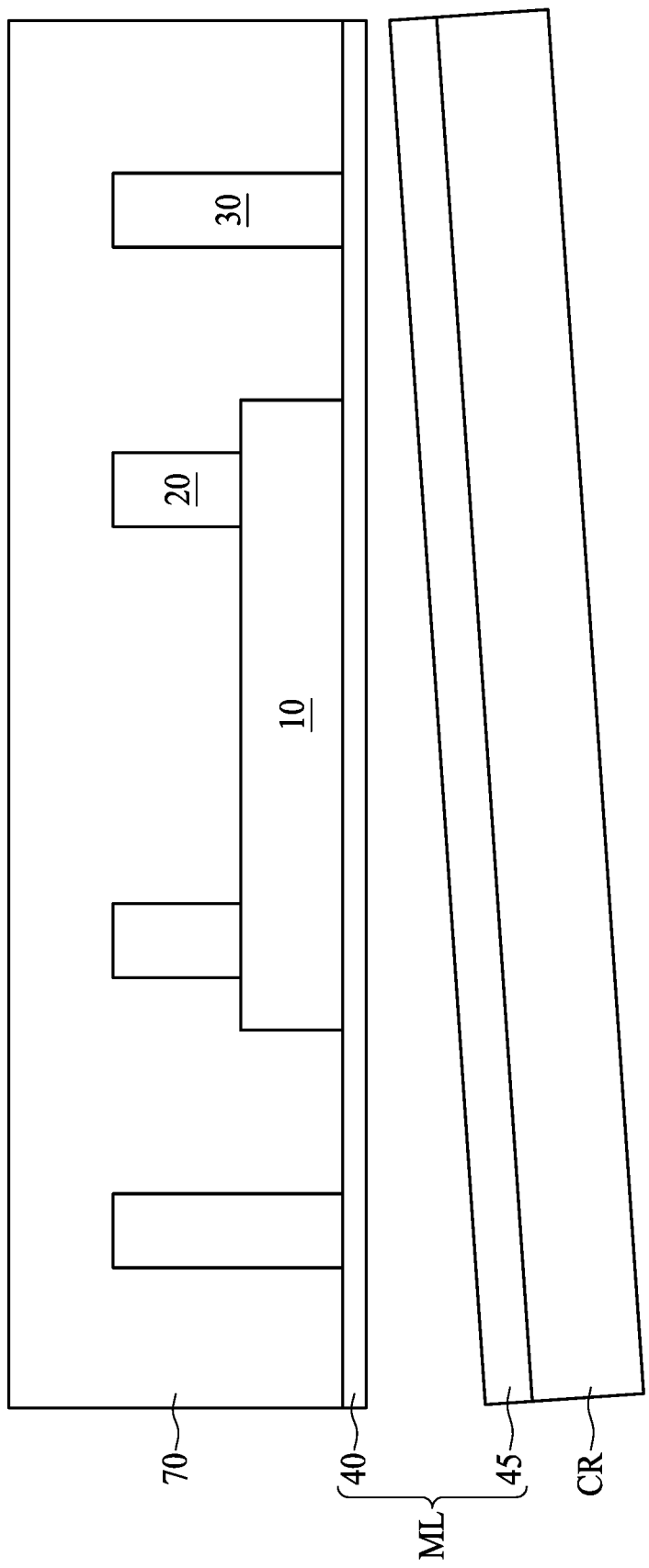

Referring to FIG. 4D, the carrier CR and the metal layer 45 of the metallic layer ML are removed. The removal operation may include a saw operation such as a wire saw operation, wherein a wire cuts between the metal layer 40 and the metal layer 45 and separates the metal layer 40 and the metal layer 45.

Figure 4E:
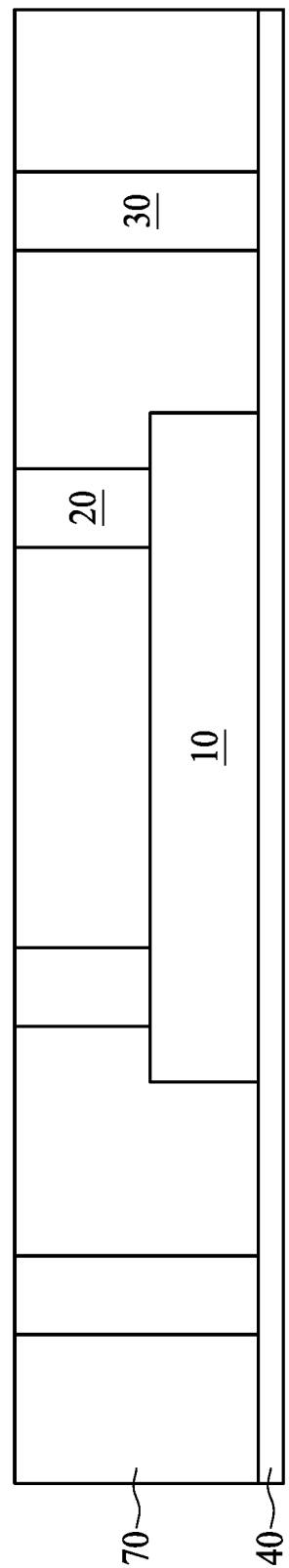

Referring to FIG. 4E, a grinding operation is performed to remove a portion of the encapsulant 70 and expose the conductive elements 20 and 30. In some embodiments, a portion of the conductive elements 20 and/or a portion of the conductive elements 30 may also be removed by the grinding operation.

Figure 4F:
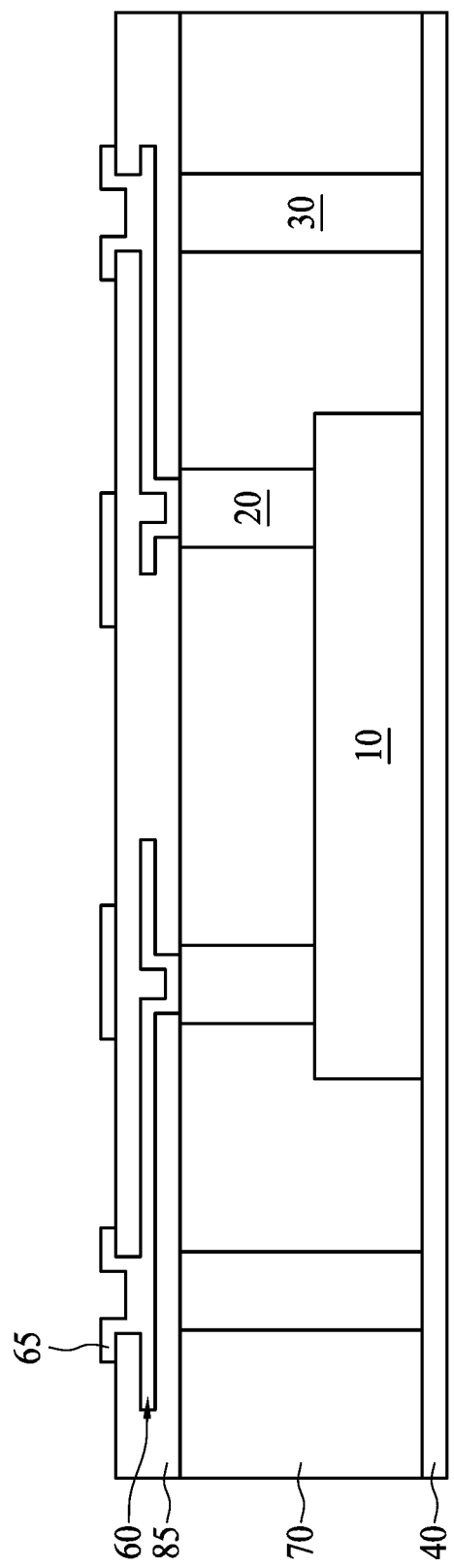

Referring to FIG. 4F, an RDL 60 is formed on the encapsulant 70. An insulation layer 85 is formed on the encapsulant 70 to surround the RDL 60. The RDL 60 may be electrically connected to the conductive elements 20 or the conductive elements 30. The RDL 60 includes UBMs 65 exposed from the insulation layer 85. The RDL 60 may be formed by a lithographic operation or a plating operation. The insulation layer 85 may be formed by a lamination operation or a screening operation.

Figure 4G:
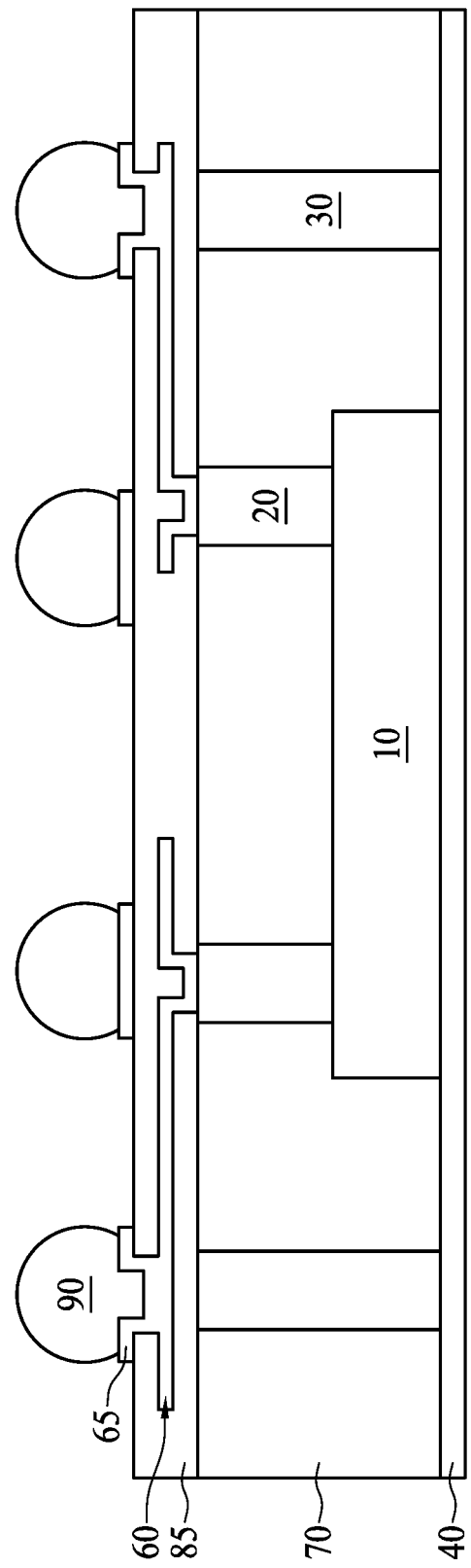
Figure 4H:
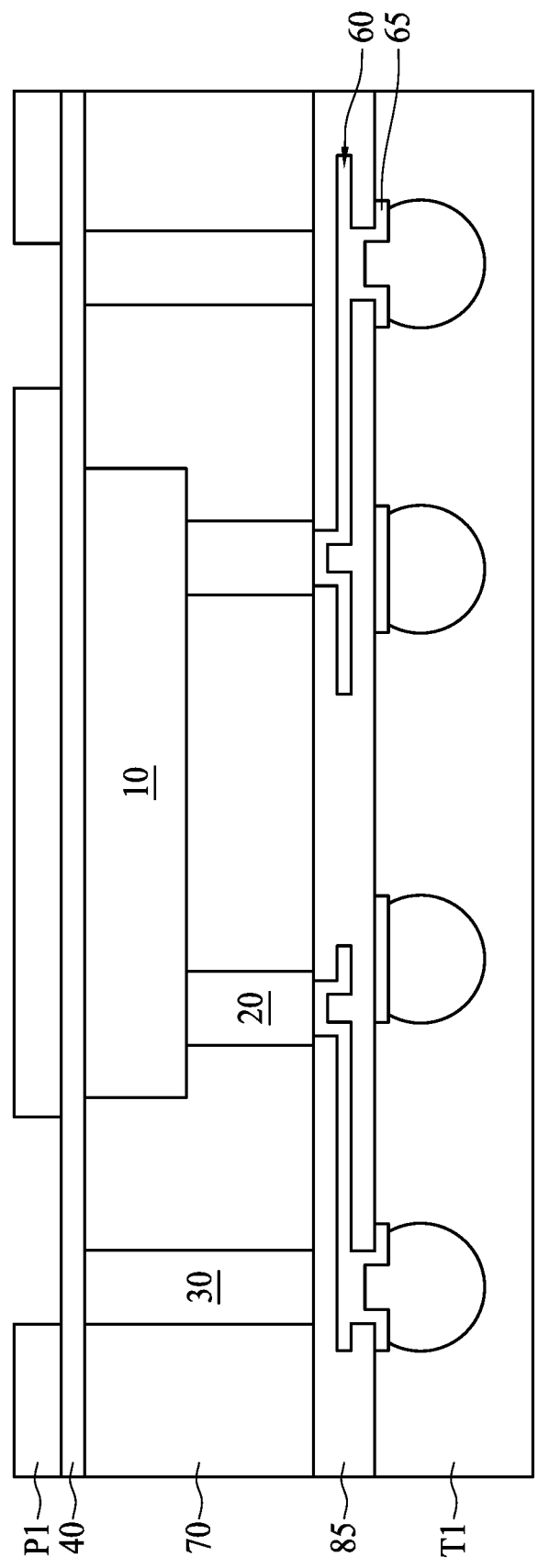

Referring to FIG. 4G, connection elements 90 are disposed on the UBMs 65 of the RDL 60. The connection elements 90 may be disposed by a ball mount operation which may include a reflow operation. Referring to FIG. 4H, a photoresist pattern P1 is disposed on the metal layer 40. The photoresist pattern P1 may be disposed by a coating operation. The photoresist pattern P1 may be exposed and developed subsequently. A tape T1 is provided on the insulation layer 85 to surround the connection elements 90, wherein a lamination operation may be performed. The tape T1 may protect the connection elements 90 in subsequent processes.

Figure 4I:
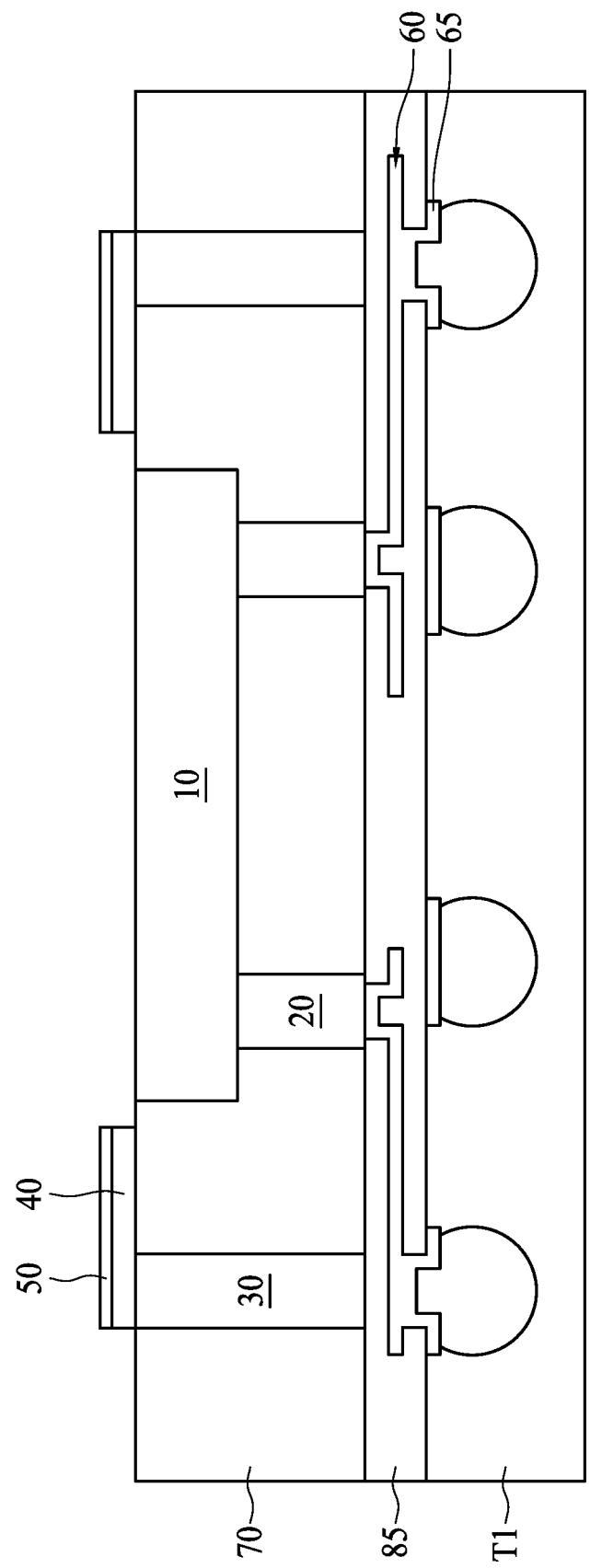
Figure 4J:
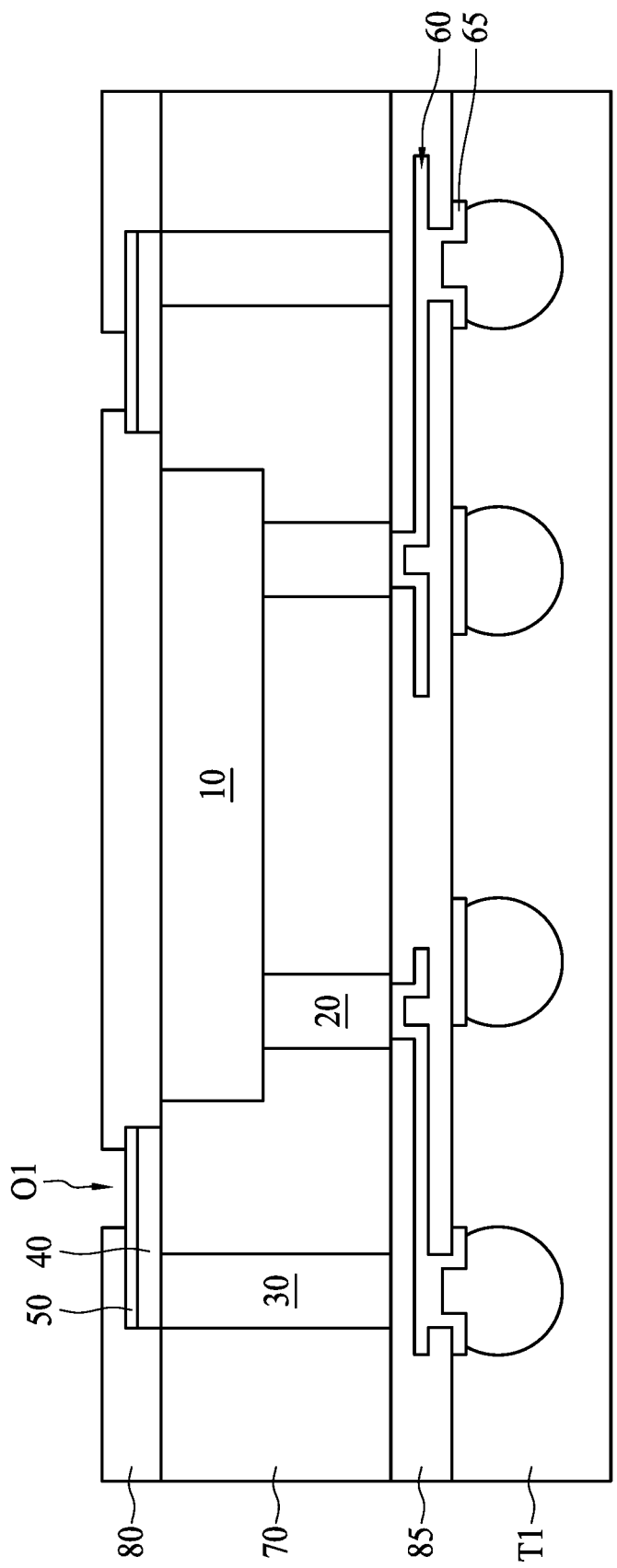

Referring to FIG. 4I, the photoresist pattern P1 and a portion of the metal layer 40 are removed, wherein an etching operation may be performed. An RDL 50 is formed on the metal layer 40, wherein the metal layer 40 may serve as a seed layer for the RDL 50. Referring to FIG. 4J, an insulation layer 80 is formed on the encapsulant 70 and the semiconductor die 10 to surround or cover the RDL 50. The insulation layer 80 may be formed by a lamination operation or a screening operation. An opening O1 is formed within the insulation layer 80 to expose the RDL 50.

Figure 4K:
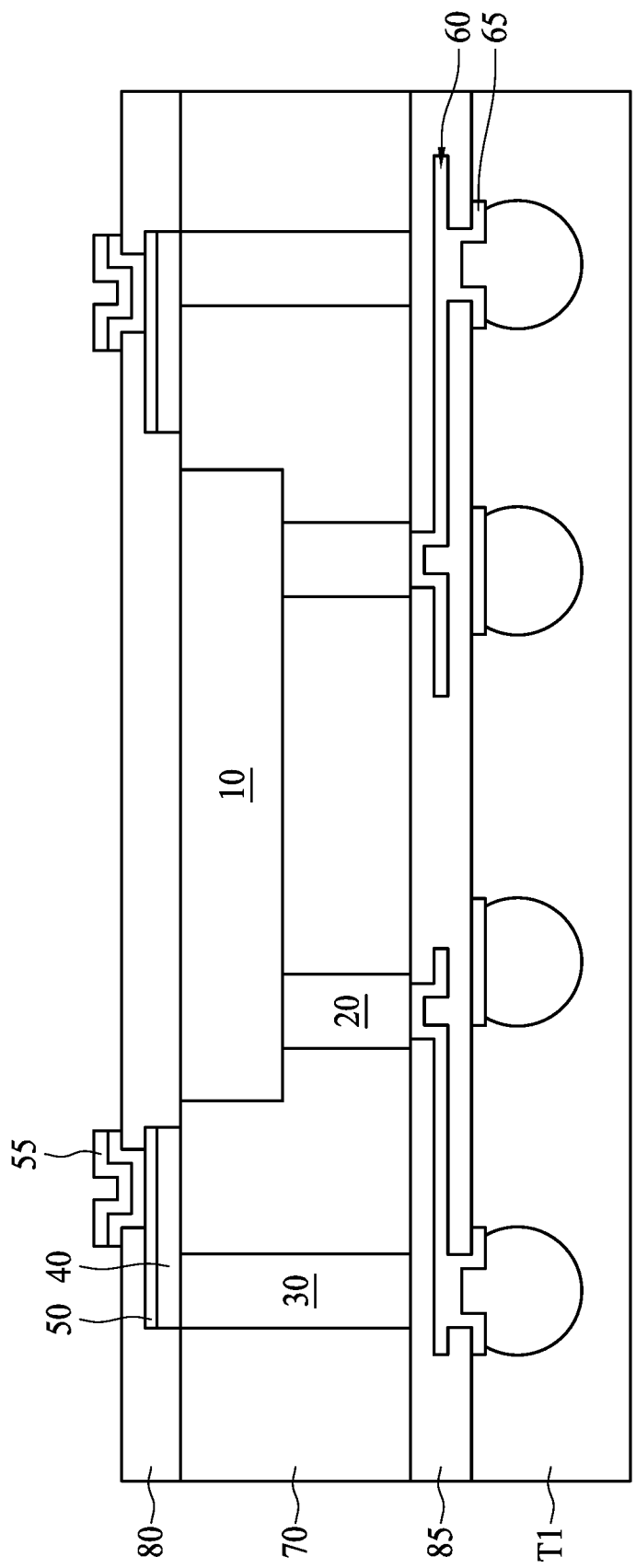
Figure 4L:
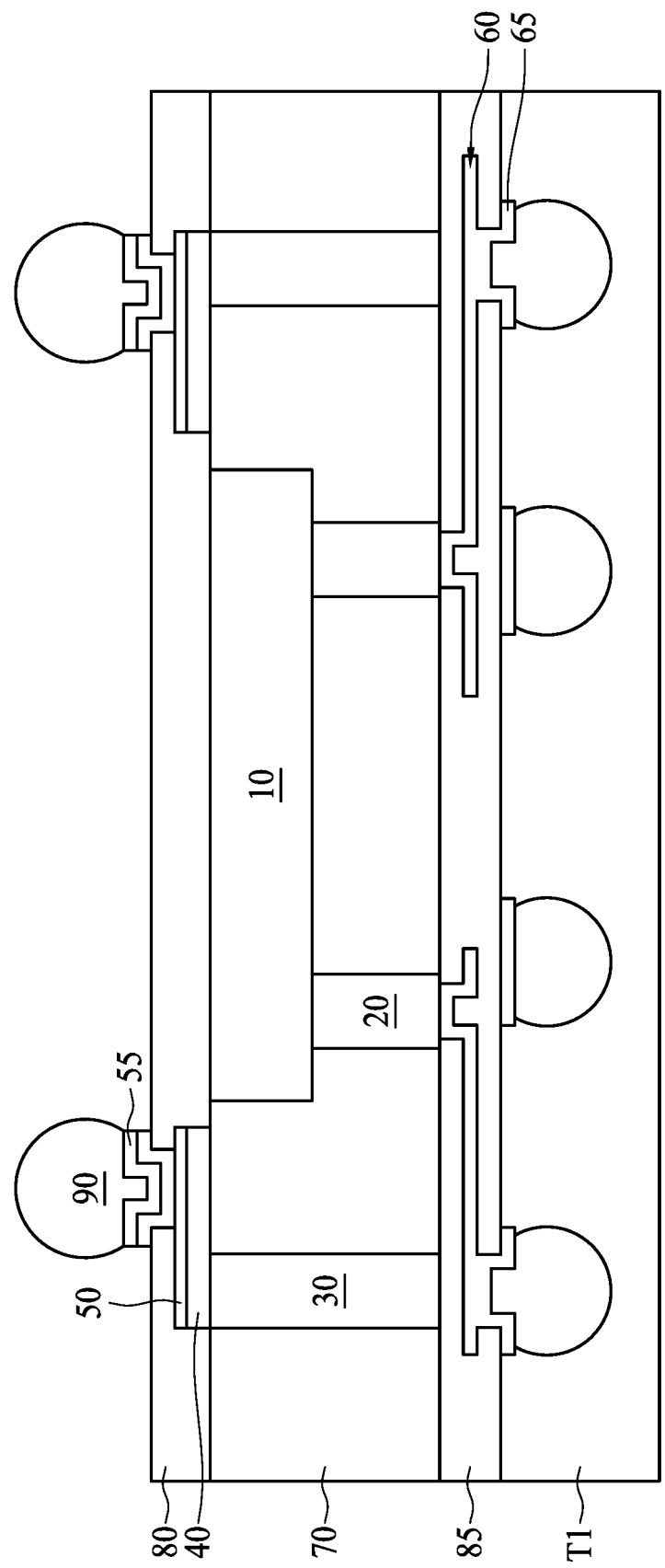
Figure 4M:
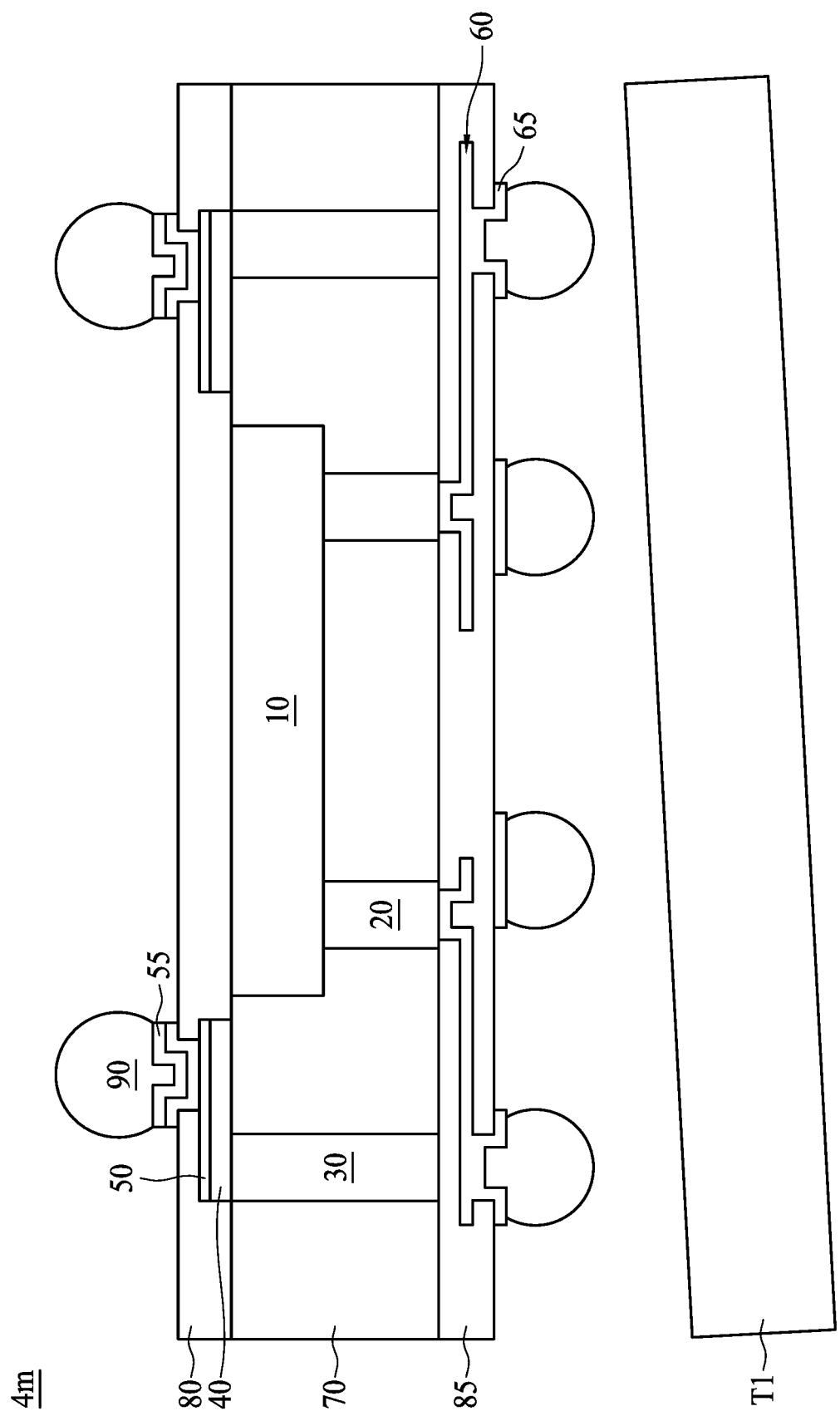

Referring to FIG. 4K, UBMs 55 are formed on the exposed portions of the RDL 50 and the insulation layer 80, wherein a plating operation may be performed. Referring to FIG. 4L, connection elements 90 are disposed on the UBMs 55. The connection elements 90 may be disposed by a ball mount operation which may include a reflow operation. Referring to FIG. 4M, the tape T1 is removed and the semiconductor device package 4m is formed. The semiconductor device package 4m may be similar to or the same as the semiconductor device package 1a of FIG. 1A.

FIG. 5A, FIG. 5B, FIG. 5C, FIG. 5D, FIG. 5E, FIG. 5F, FIG. 5G, FIG. 5H, FIG. 5I, FIG. 5J, FIG. 5K, FIG. 5L, FIG. 5M, FIG. 5N and FIG. 5O are cross-sectional views of a semiconductor device package 5p fabricated at various stages, in accordance with some embodiments of the present disclosure.

Figure 5A:
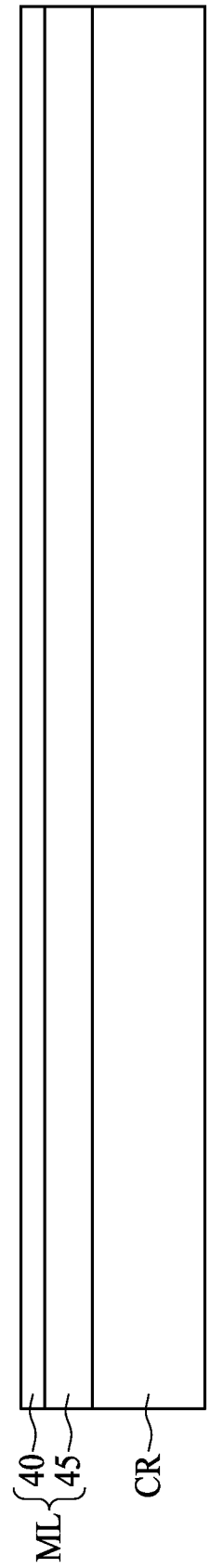
FIG. 5A, FIG. 5B, FIG. 5C, FIG. 5D, FIG. 5E, FIG. 5F, FIG. 5G, FIG. 5H, FIG. 5I, FIG. 5J, FIG. 5K, FIG. 5L, FIG. 5M, FIG. 5N and FIG. 5O are cross-sectional views of a semiconductor device package fabricated at various stages, in accordance with some embodiments of the present disclosure.

Referring to FIG. 5A, a carrier CR is provided. The carrier CR may include glass or other materials. A metallic layer ML is provided on the carrier CR. The metallic layer ML includes a metal layer 45 disposed on and in contact with the carrier CR and a metal layer 40 disposed on the metal layer 45. The metal layer 40 and/or the metal layer 45 may have similar properties to the metal layer 40 of the semiconductor device package 1a in FIG. 1A. A thickness of the metal layer 40 may be equal to or greater than 1 μm. For example, the thickness of the metal layer 40 may be in a range from 3 μm to 5 μm. A thickness of the metal layer 45 may be equal to or greater than 15 μm. For example, the thickness of the metal layer 45 may be 18 μm. The thickness configuration of the metal layers 40 and 45 may facilitate the operation of separating the metal layer 40 and the metal layer 45 illustrated in FIG. 5D.

Figure 5B:
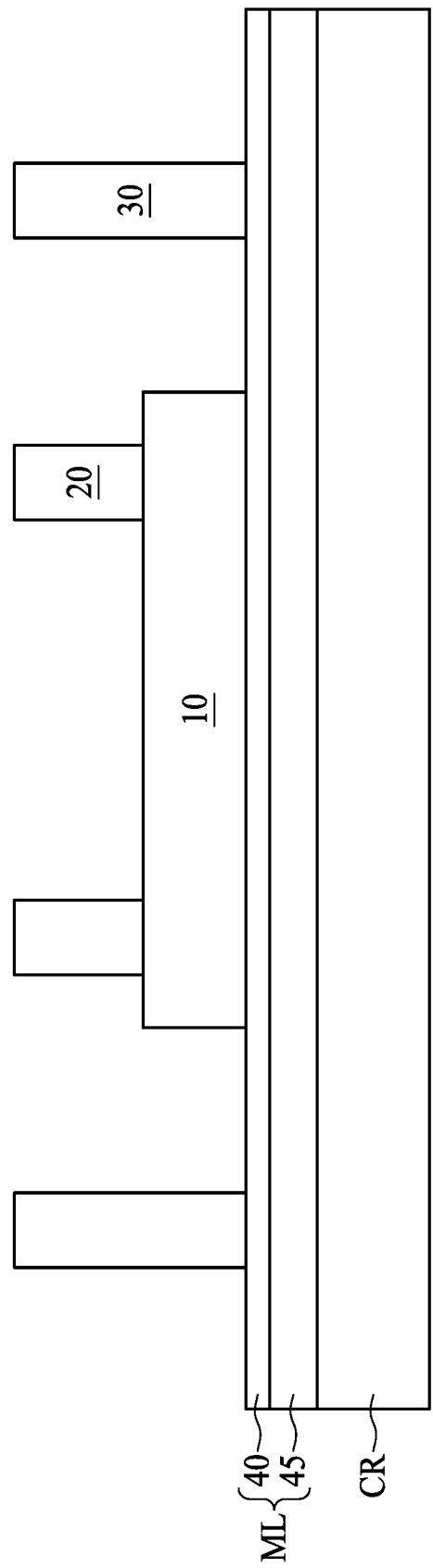

Referring to FIG. 5B, a semiconductor die 10 is disposed on the layer M2 of the metallic layer ML. The semiconductor die 10 may be disposed by a die bonding operation or flip-chip bonding operation which may include a curing operation. Conductive elements 20 are disposed on the semiconductor die 10 and may be electrically connected to a circuit of the semiconductor die 10, wherein the circuit may be on an active surface of the semiconductor die 10. Conductive elements 30 are disposed on the metal layer 40 and may be connected to the metal layer 40 by a metallic bonding force, wherein a curing operation may be performed.

Figure 5C:
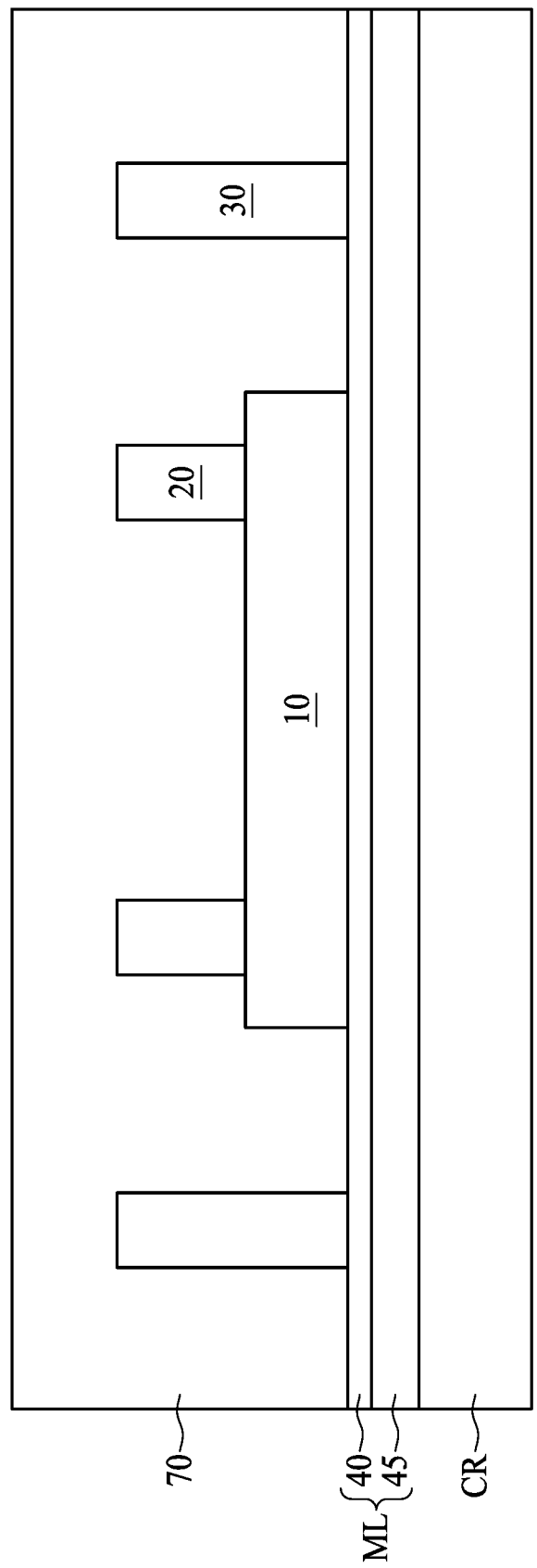

Referring to FIG. 5C, an encapsulant 70 is formed on the metal layer 40 and the semiconductor die 10. The encapsulant 70 encapsulates or covers the conductive elements 20, the conductive elements 30, the semiconductor die 10 and the metal layer 40 of the metallic layer ML. The encapsulant 70 may be formed by a molding operation.

Figure 5D:
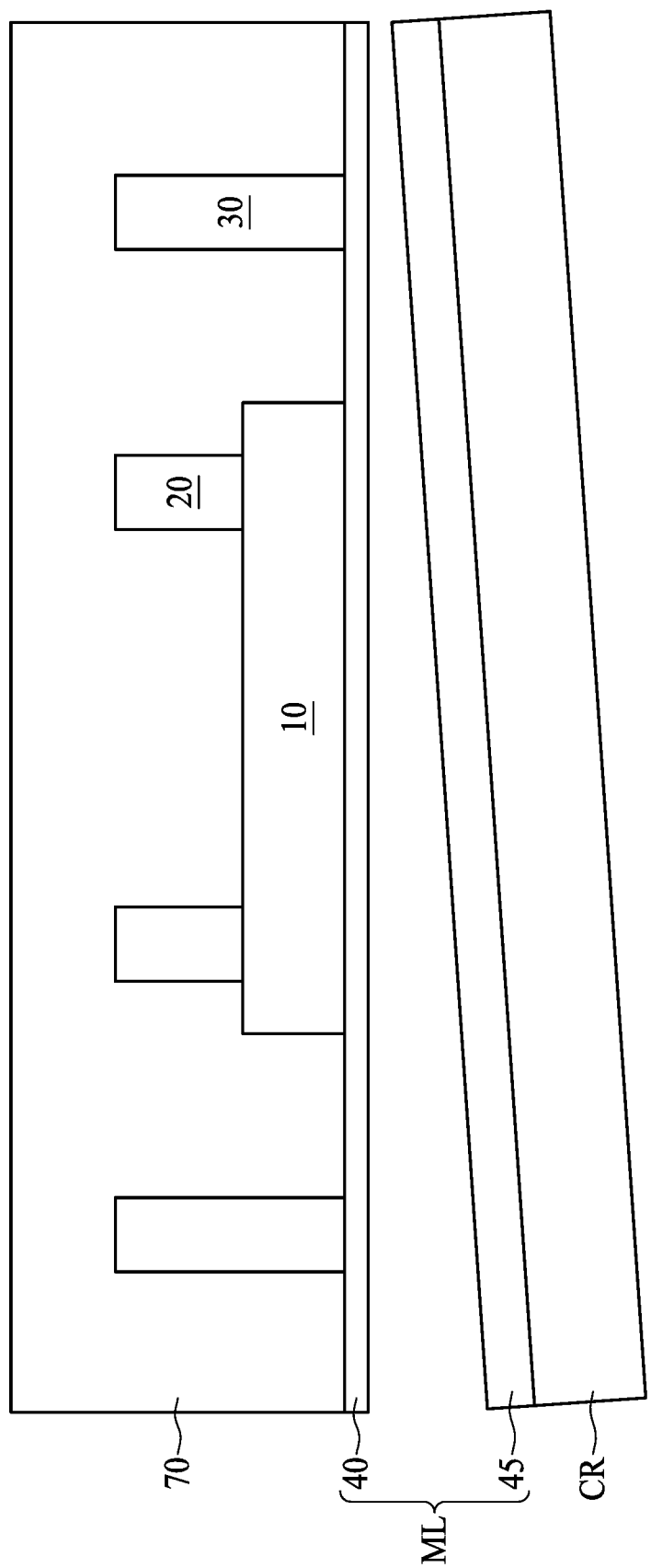

Referring to FIG. 5D, the carrier CR and the metal layer 45 of the metallic layer ML are removed. The removal operation may include a saw operation such as a wire saw operation, wherein a wire cuts between the metal layer 40 and the metal layer 45 and separates the metal layer 40 and the metal layer 45.

Figure 5E:
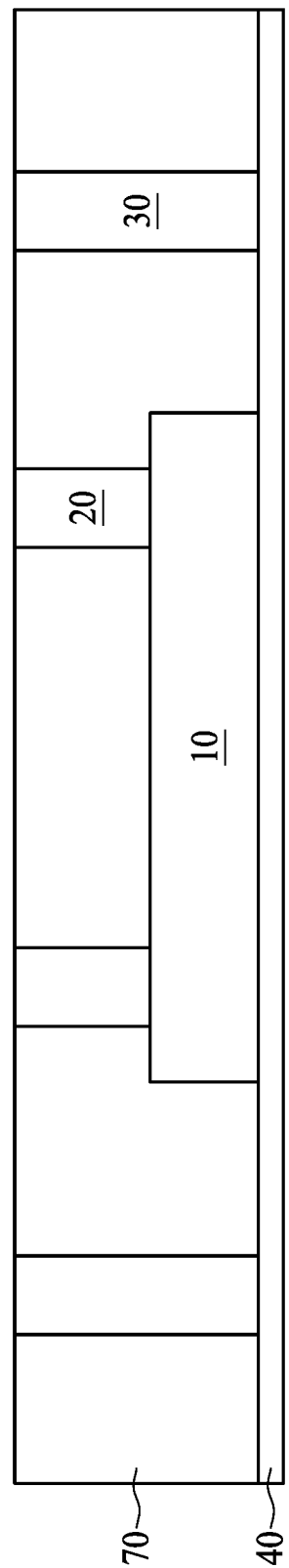

Referring to FIG. 5E, a grinding operation is performed to remove a portion of the encapsulant 70 and expose the conductive elements 20 and 30. In some embodiments, a portion of the conductive elements 20 and/or a portion of the conductive elements 30 may also be removed by the grinding operation.

Figure 5F:
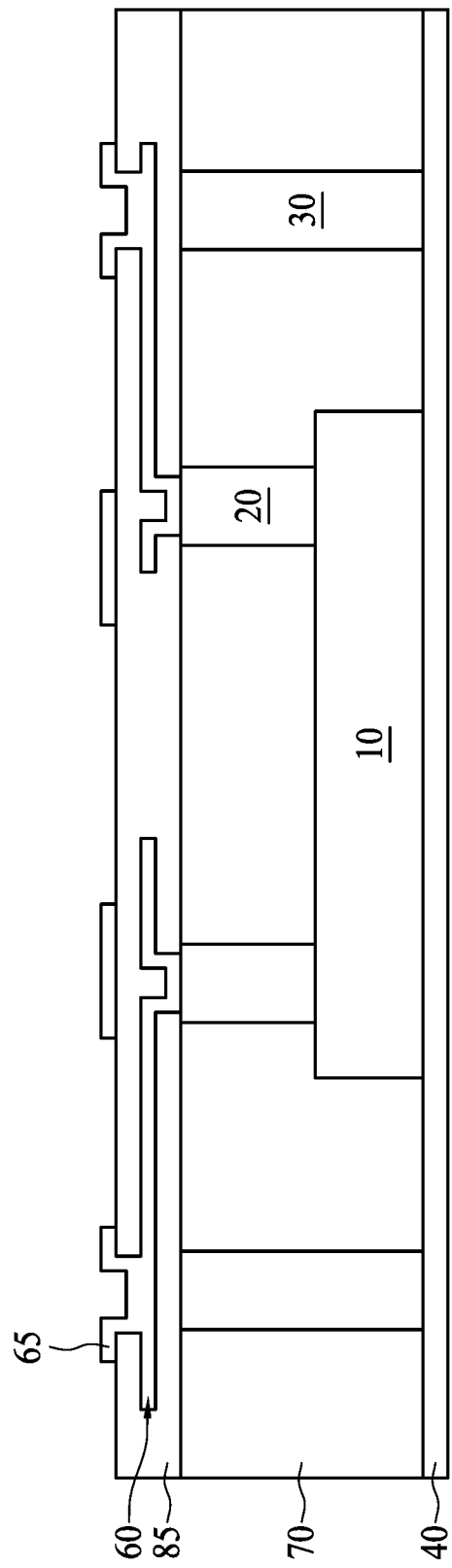

Referring to FIG. 5F, an RDL 60 is formed on the encapsulant 70. An insulation layer 85 is formed on the encapsulant 70 to surround the RDL 60. The RDL 60 may be electrically connected to the conductive elements 20 or the conductive elements 30. The RDL 60 includes UBMs 65 exposed from the insulation layer 85. The RDL 60 may be formed by a lithographic operation or a plating operation. The insulation layer 85 may be formed by a lamination operation or a screening operation.

Figure 5G:
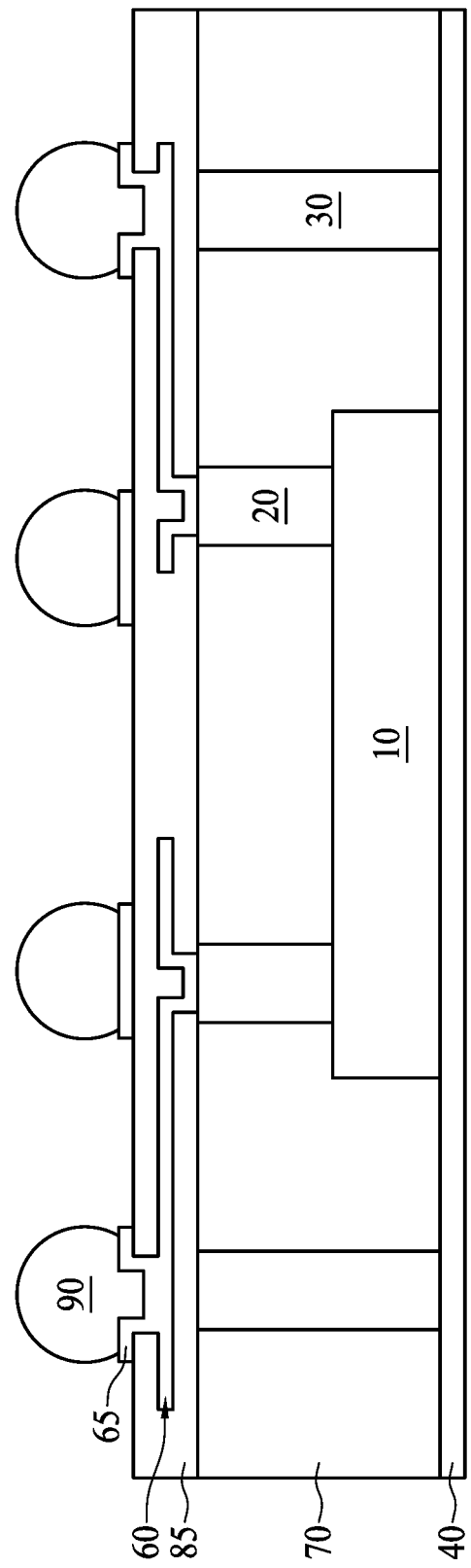
Figure 5H:
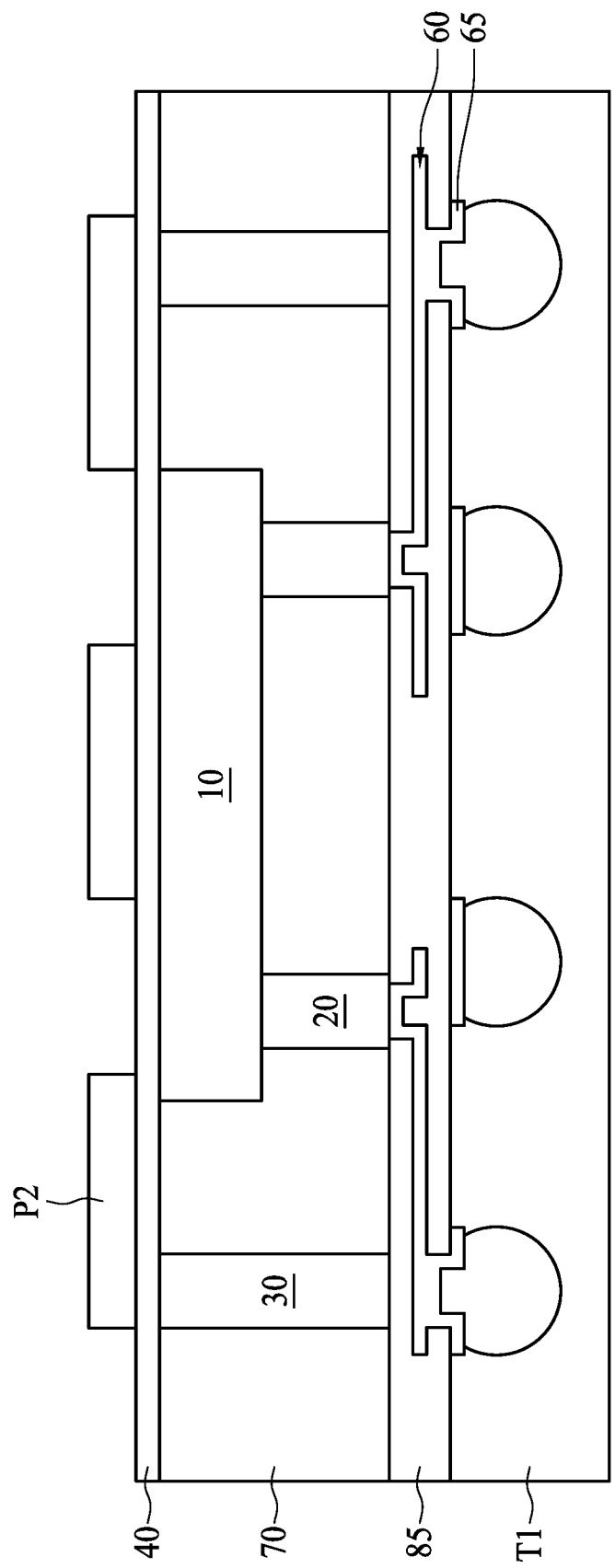

Referring to FIG. 5G, connection elements 90 are disposed on the UBMs 65 of the RDL 60. The connection elements 90 may be disposed by a ball mount operation which may include a reflow operation. Referring to FIG. 5H, a photoresist pattern P2 is disposed on the metal layer 40. The photoresist pattern P2 may be disposed by a coating operation. The photoresist pattern P2 may be exposed and developed subsequently. A tape T1 is provided on the insulation layer 85 to surround the connection elements 90, wherein a lamination operation may be performed. The tape T1 may protect the connection elements 90 in subsequent processes.

Figure 5I:
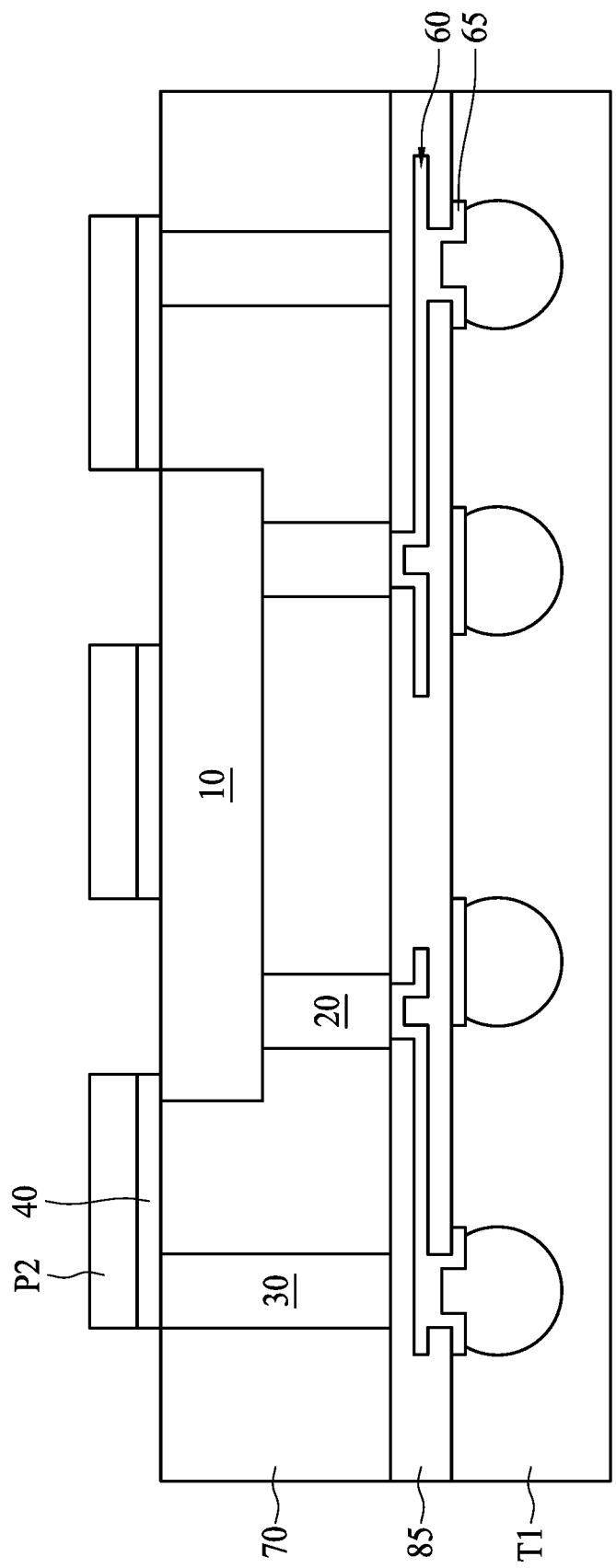
Figure 5J:
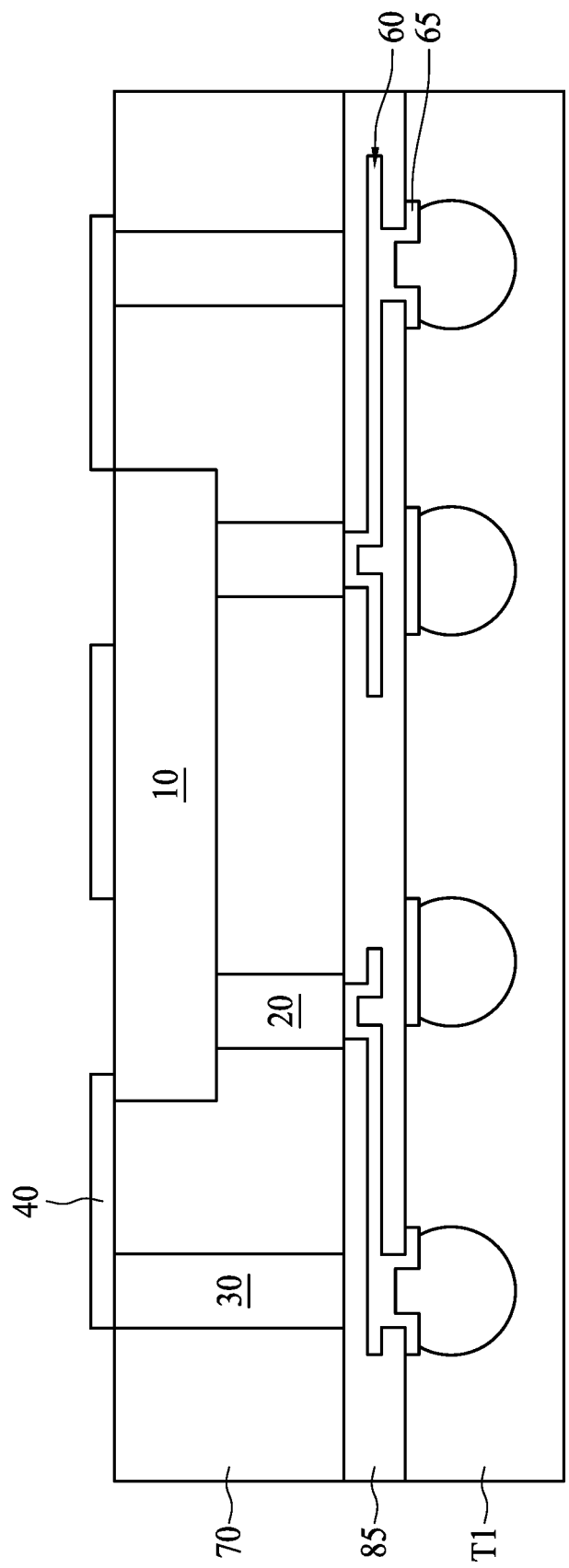
Figure 5K:
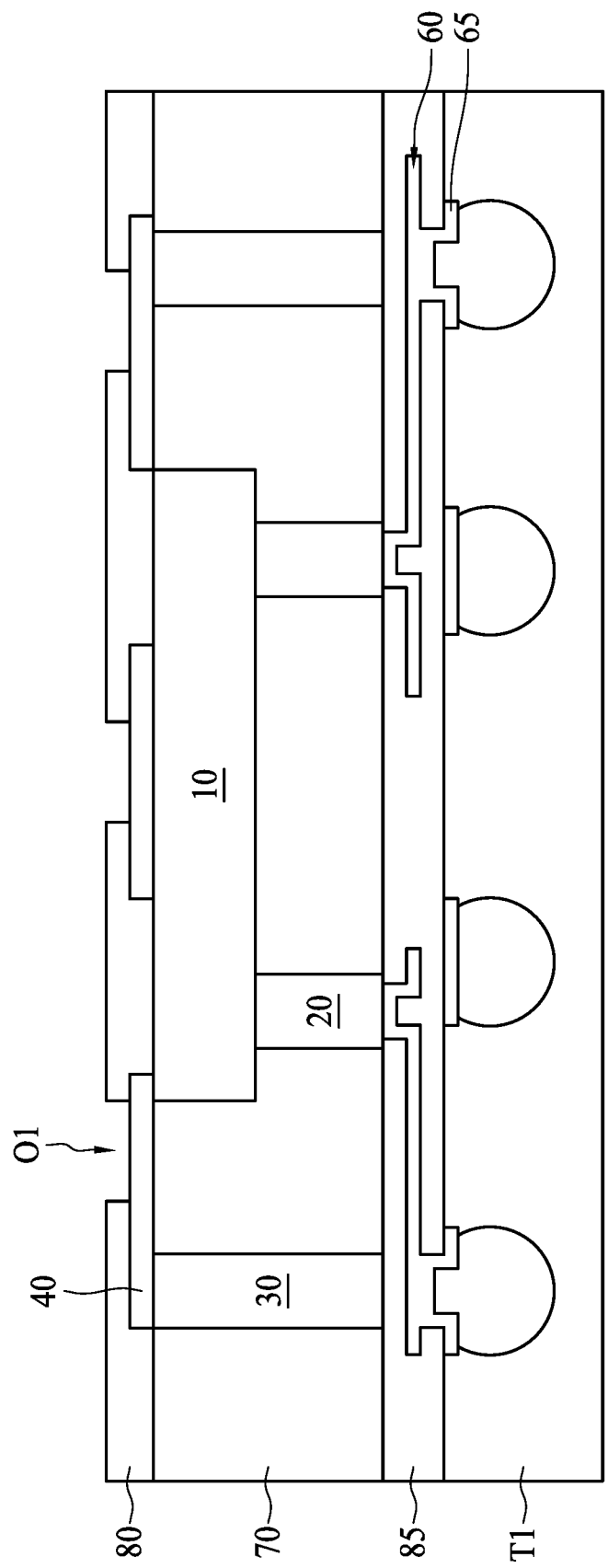

Referring to FIG. 5I, a portion of the metal layer 40 is removed, wherein an etching operation may be performed. Referring to FIG. 5J, the photoresist pattern P2 is removed to expose the metal layer 40, wherein an etching operation may be performed. Referring to FIG. 5K, an insulation layer 80 is formed on the encapsulant 70 and the semiconductor die 10 to surround or cover the metal layer 40. The insulation layer 80 may be formed by a lamination operation or a screening operation. An opening O1 is formed within the insulation layer 80 to expose the metal layer 40.

Figure 5L:
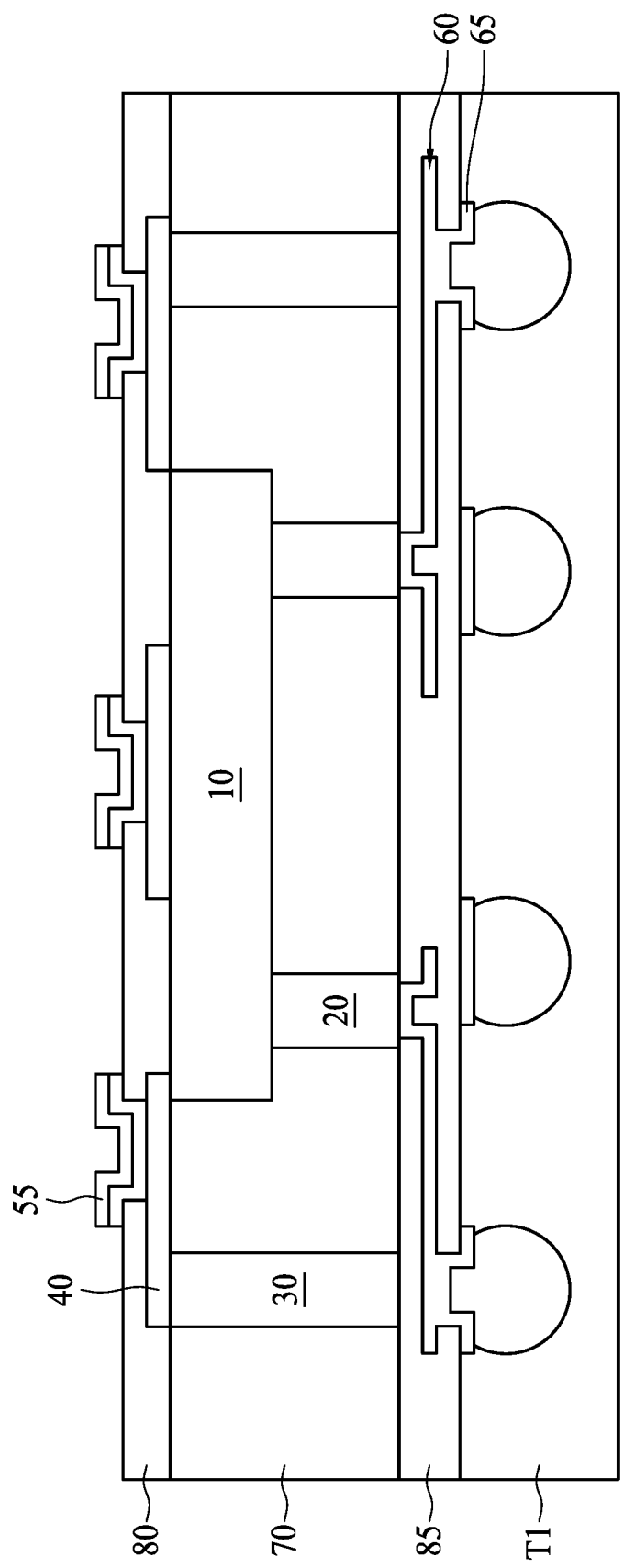
Figure 5M:
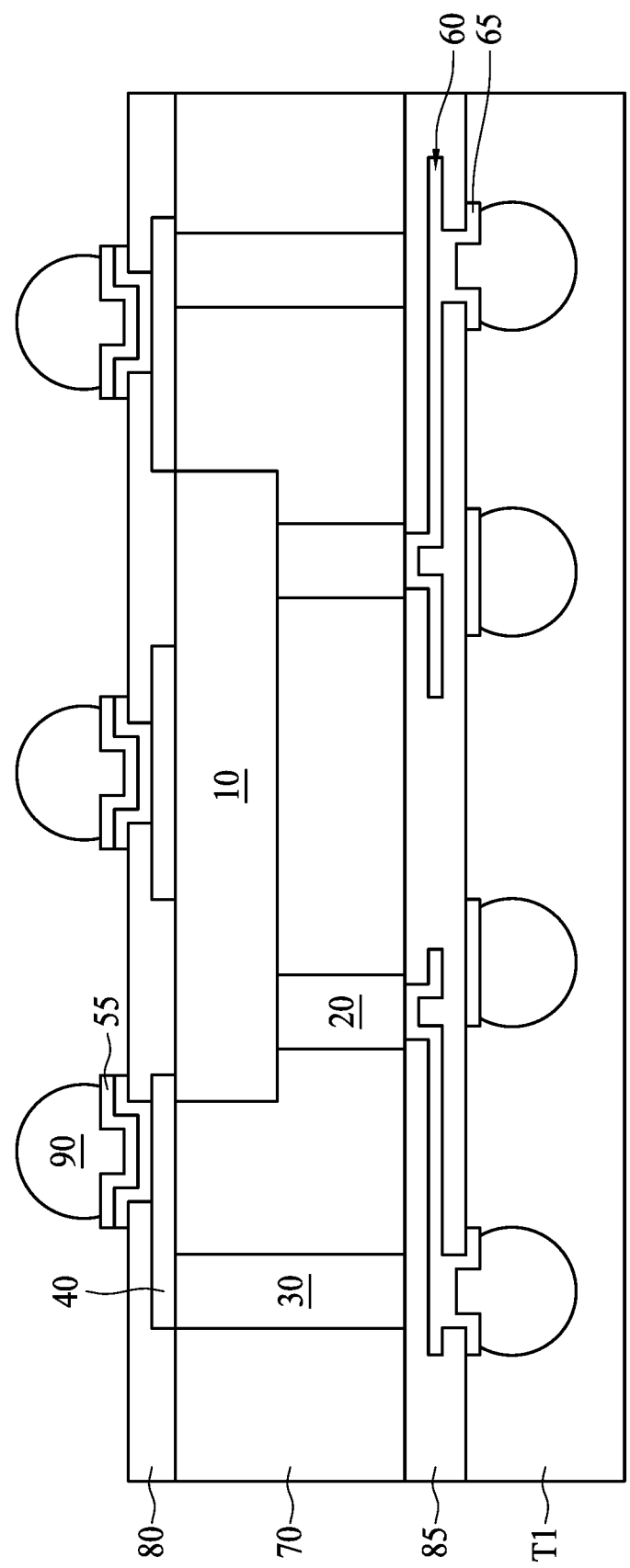
Figure 5N:
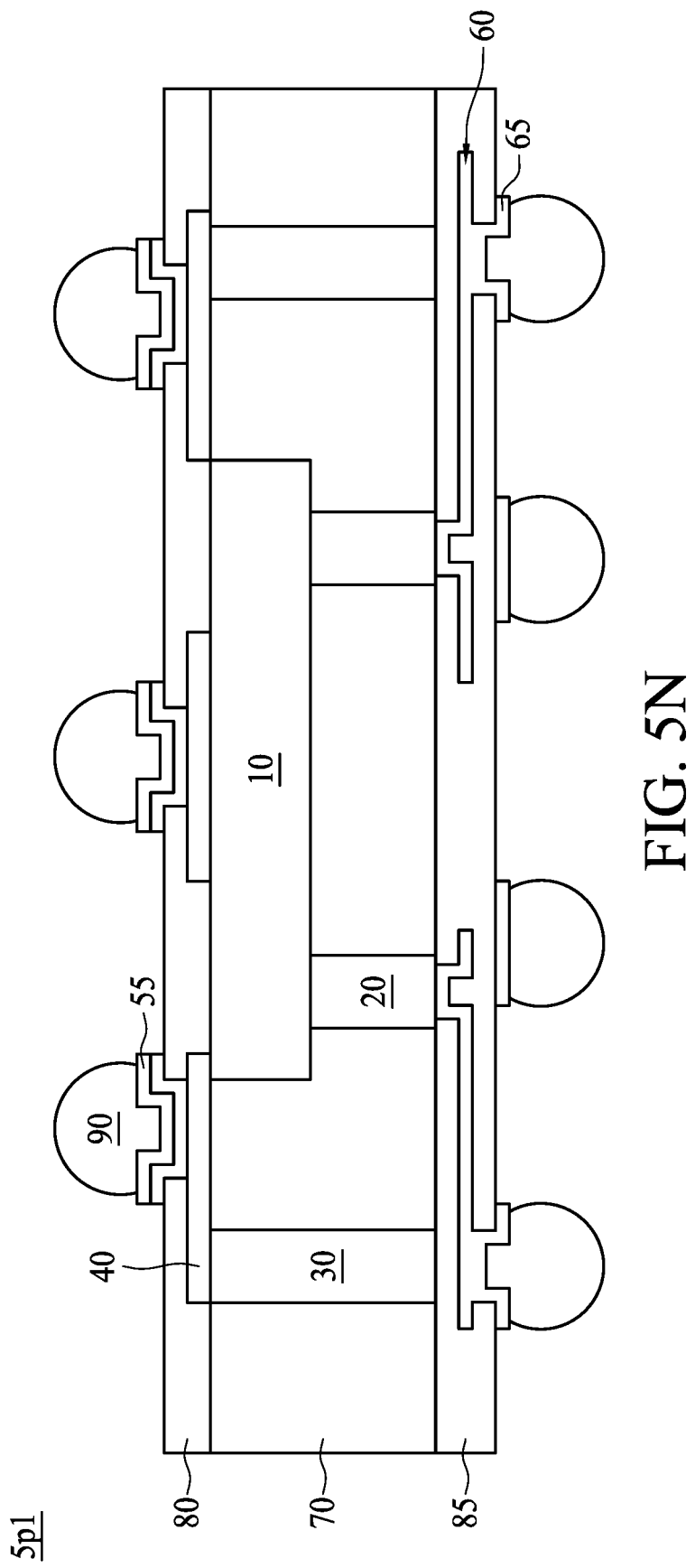
Figure 5O:
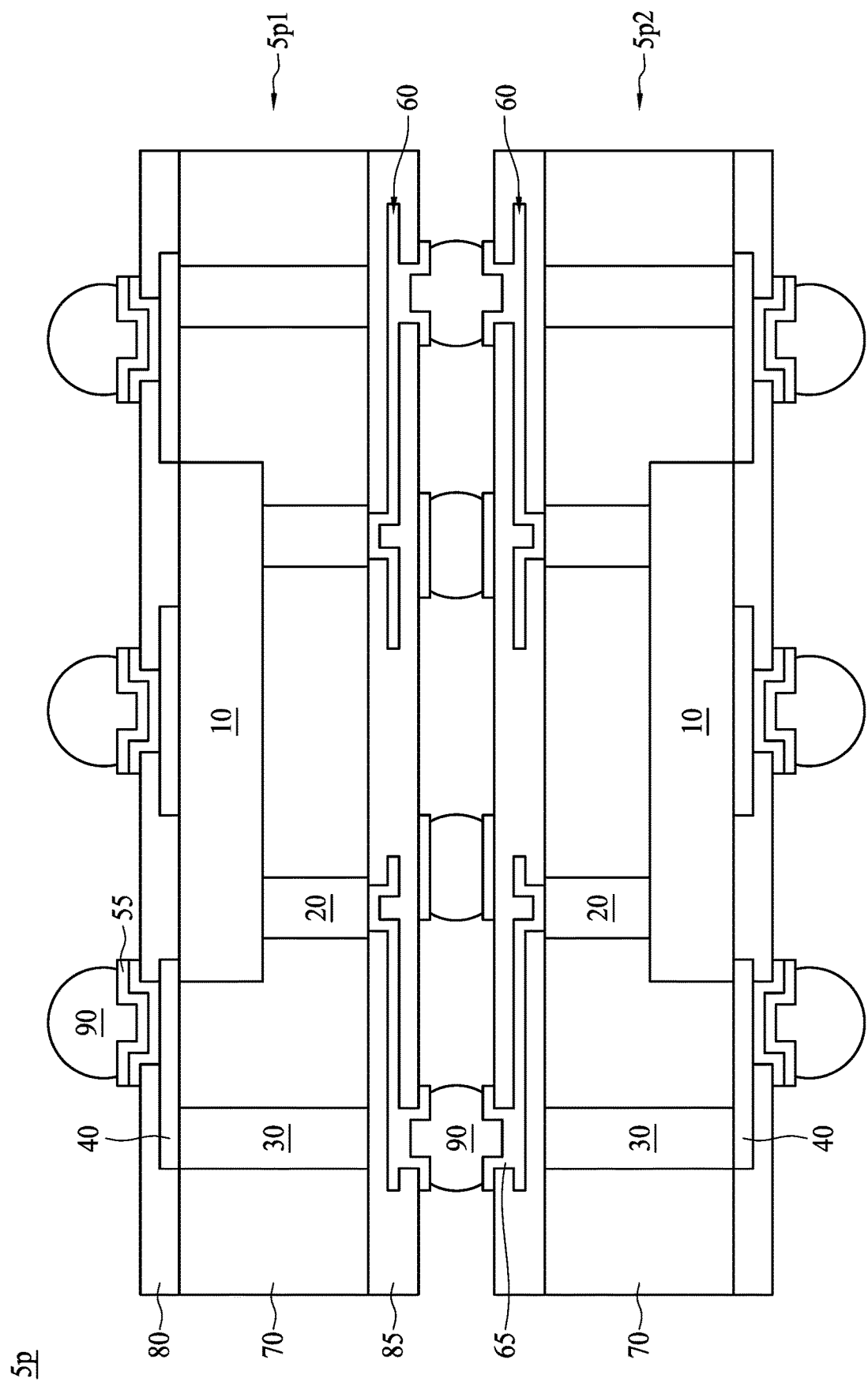

Referring to FIG. 5L, an RDL or UBM 55 is formed on the exposed portion of the metal layer 40 and the insulation layer 80, wherein a plating operation may be performed. Referring to FIG. 5M, connection elements 90 are disposed on the UBMs 55. The connection elements 90 may be disposed by a ball mount operation which may include a reflow operation. Referring to FIG. 5N, the tape T1 is removed and a semiconductor device package 5p1 is formed to expose the connection elements 90. Referring to FIG. 5O, a semiconductor device package 5p2 similar to the semiconductor device package 5p1 is provided. The semiconductor device packages 5p1 and 5p2 are combined and electrically connected by the connection elements 90 to form a semiconductor device package 5p, wherein a reflow operation may be performed. The semiconductor device package 5p may be similar to or the same as the semiconductor device package 3a of FIG. 3.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be planar or substantially planar if a difference between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
a semiconductor die, comprising a backside surface and an active surface opposite to the backside surface;
a first conductive element disposed on the active surface of the semiconductor die;
a second conductive element disposed next to the semiconductor die, the second conductive element having a first surface and a second surface opposite to the first surface;
an encapsulant encapsulating the semiconductor die, lateral surface of the first conductive element, and lateral surface of the second conductive element, wherein the encapsulant has a first surface coplanar with the backside surface of the semiconductor die and a second surface opposite to the first surface, and the second surface of the encapsulant is coplanar with a surface of the first conductive element and the second surface of the second conductive element; and
a metal layer in direct contact with the first surface of the encapsulant, the metal layer having a surface coplanar with the first surface of the encapsulant and the first surface of the second conductive element.

2. The semiconductor device package of claim 1, further comprising a first RDL disposed on the second surface of the encapsulant, wherein the first RDL is electrically connected to the first conductive element, and the first RDL is electrically connected to the second conductive element through the first conductive element.

3. The semiconductor device package of claim 1, wherein a sidewall of the metal layer defines a first recess.

4. The semiconductor device package of claim 3, further comprising a second RDL disposed on the metal layer, wherein a sidewall of the second RDL defines a second recess.

5. The semiconductor device package of claim 4, further comprising:
a first UBM on the second RDL; and
a first connection element on the first UBM.

6. The semiconductor device package of claim 5, further comprising:
a second under bump metallurgy (UBM) on the first RDL; and
a second connection element on the second UBM.

7. The semiconductor device package of claim 1, wherein the encapsulant directly contacts the first conductive element and the second conductive element.

8. The semiconductor device package of claim 2, wherein the second conductive element directly contacts the metal layer and the first RDL.

9. The semiconductor device package of claim 1, wherein a height of the second conductive element is a sum of a height of the first conductive element and a thickness of the semiconductor die.

10. The semiconductor device package of claim 4, wherein the sidewall of the metal layer and the sidewall of the second RDL form a continuous surface.

11. The semiconductor device package of claim 1, further comprising a second RDL electrically connected to the metal layer, and a gap is defined between the metal layer and the second RDL.

12. A semiconductor device package, comprising
a semiconductor die, comprising a backside surface and an active surface;
a first conductive element disposed on the active surface of the semiconductor die;
an encapsulant encapsulating the semiconductor die and the first conductive element, the encapsulant comprising a first surface coplanar with the backside surface of the semiconductor die and a second surface opposite to the first surface of the encapsulant, the second surface of the encapsulant being coplanar with a surface of the first conductive element;
a first RDL disposed on the second surface of the encapsulant and electrically connected to the first conductive element; and
a metal layer directly contacting the backside surface of the semiconductor die and the first surface of the encapsulant.

13. The semiconductor device package of claim 12, wherein a lateral surface of the metal layer defines a first recess.

14. The semiconductor device package of claim 13, further comprising a second RDL, wherein the second RDL directly contacts the metal layer, and a lateral surface of the second RDL defines a second recess connected to the first recess.

15. The semiconductor device package of claim 14, wherein a gap is defined between the metal layer and the second RDL.

16. The semiconductor device package of claim 1, wherein the first conductive element is a conductive pillar, and a height of the first conductive element is between 20 µm and 30 µm.

17. The semiconductor device package of claim 1, wherein the metal layer covers the first surface of the encapsulant and the backside surface of the semiconductor die.

18. The semiconductor device package of claim 12, further comprising a second conductive element spaced apart from the semiconductor die.

19. The semiconductor device package of claim 18, wherein the encapsulant encapsulates the second conductive element, and the second conductive element is electrically connected to the first RDL and the second RDL.

20. The semiconductor device package of claim 19, wherein the first conductive element is electrically connected to the first RDL, and the second conductive element is electrically connected to the metal layer and the first RDL.

* * * * *